United States Patent [19]

Gong

[11] Patent Number: 5,801,652
[45] Date of Patent: Sep. 1, 1998

[54] PATTERN DEPENDENT NOISE REDUCTION IN A DIGITAL PROCESSING CIRCUIT UTILIZING IMAGE CIRCUITRY

[75] Inventor: Xue Mei Gong, Austin, Tex.

[73] Assignee: Cirrus Logic, Inc., Fremont, Calif.

[21] Appl. No.: 735,573

[22] Filed: Oct. 23, 1996

Related U.S. Application Data

[63] Continuation of Ser. No. 307,520, Sep. 16, 1994, abandoned, which is a continuation-in-part of Ser. No. 273,473, Jul. 8, 1994, abandoned.

[51] Int. Cl.$^6$ ............................ H03M 1/00; H03M 1/36
[52] U.S. Cl. ..................... 341/131; 341/118; 364/724.01
[58] Field of Search ................................. 341/131, 118; 364/724.01, 724.11, 724.13, 724.16

[56] References Cited

U.S. PATENT DOCUMENTS

| | | |
|---|---|---|
| 4,186,384 | 1/1980 | Acker . |
| 4,227,185 | 10/1980 | Kronlage . |
| 4,439,756 | 3/1984 | Shenoi et al. . |
| 4,495,591 | 1/1985 | Loomis, Jr. . |
| 4,509,037 | 4/1985 | Harris . |
| 4,746,899 | 5/1988 | Swanson et al. ........................ 341/122 |
| 4,972,436 | 11/1990 | Halim et al. . |
| 4,999,632 | 3/1991 | Parks . |
| 5,012,178 | 4/1991 | Weiss et al. . |
| 5,012,244 | 4/1991 | Wellard et al. . |
| 5,027,120 | 6/1991 | Thurston . |
| 5,039,989 | 8/1991 | Welland et al. . |
| 5,061,925 | 10/1991 | Sooch et al. . |

(List continued on next page.)

FOREIGN PATENT DOCUMENTS 1 577 007   10/1980   United Kingdom .

OTHER PUBLICATIONS

"A Monolithic 20-b Delta-Sigma A/D Converter", Bruce P. DelSignore, Donald A. Kert, Navdeept S. Sooch and Eric J. Swanson, IEEE Journal of Solid State Circuits, vol. 25, No. 6, Dec. 1990.

"Design and Implementation of an Audio 18-Bit Analog--to-Digital Converter Using Oversampling Techniques", Robert W. Adams, J. Aucio Eng. Soc., vol. 34, pp. 153-166, Mar. 1986.

"Transmission Systems for Communications", AT&T Bell Laboratories, Copyright 1959, 1964, 1970, 1982.

"Digitally Corrected Multi-Bit ΣΔ Data Converters", T. Cataltepe, A.R. Kramer, L.E. Larson, G.C. Temes and R.H. Walden, IEEE Proc., ISCAS'89, pp. 647-650, May 1989.

"A Noise-Shaping Coder Topology for 15+Bit Converters", L. Richard Carley, IEEE J. Solid-State Circuits, vol. SC-24, pp. 267-273, Apr. 1989.

*Primary Examiner*—Jeffrey A. Gaffin
*Assistant Examiner*—Peguy Jean Pierre
*Attorney, Agent, or Firm*—Gregory M. Howison; J. P. Violette

[57] ABSTRACT

A delta-sigma analog/digital converter is provided for operating in the analog domain to generate a digital value that is to be processed by a digital signal processor (DSP) (26) to provide on the output a digital output. Each data node in each processing element in the DSP (26) is mirrored by the way of a corresponding data node in the mirror circuit (36). This results in the addition of noise via a noise adder (28) such that each data node in the main portion of the DSP (26) that can draw current from the power supply during a transition will have a corresponding complement node in the mirror circuit (36). Each data node in the mirror circuit will add noise via a transition drawing current from the power supply whenever the transition does not occur at the corresponding data node in the main portion of the DSP (26). Therefore, di/dt noise will be added for each cycle, regardless of the data pattern. This is effected by insuring that, for each data cycle, each data node undergoes a positive and a negative transition. By using a return-to-zero data stream, i.e., inserting a zero in each cycle at each data node, a positive transition and a negative transition can be during each data cycle.

43 Claims, 12 Drawing Sheets

U.S. PATENT DOCUMENTS

| | | |
|---|---|---|
| 5,079,550 | 1/1992 | Sooch et al. . |
| 5,084,702 | 1/1992 | Ribner . |
| 5,148,166 | 9/1992 | Ribner . |
| 5,148,167 | 9/1992 | Ribner . |
| 5,150,120 | 9/1992 | Yunus . |
| 5,196,853 | 3/1993 | Abbiate et al. . |
| 5,245,344 | 9/1993 | Sooch . |
| 5,257,026 | 10/1993 | Thompson et al. ............... 341/118 |
| 5,311,549 | 5/1994 | Mahieux . |
| 5,313,205 | 5/1994 | Wilson . |
| 5,323,157 | 6/1994 | Ledzius et al. . |
| 5,351,050 | 9/1994 | Thompson et al. . |
| 5,363,101 | 11/1994 | Ueki . |
| 5,369,404 | 11/1994 | Galton . |
| 5,416,481 | 5/1995 | Chen . |
| 5,493,297 | 2/1996 | Nguyen et al. . |
| 5,528,239 | 6/1996 | Swanson et al. . |

PATTERN DEPENDENT NOISE REDUCTION IN A DIGITAL PROCESSING CIRCUIT UTILIZING IMAGE CIRCUITRY

This application is a continuation of application Ser. No. 08/307,520 filed on Sep. 16, 1994 which is now abandoned and which is a continuation-in-part of application Ser. No. 08/273,473, filed on Jul. 8, 1994, which is also abandoned.

TECHNICAL FIELD OF THE INVENTION

The present field of the invention pertains in general to a digital processing system and, more importantly, to a combination digital processing system/analog processing system, such as a delta-sigma converter wherein pattern dependent noise generated by the digital processing portion is reduced.

BACKGROUND OF THE INVENTION

Digital signal processors (DSPs) have been utilized widely due to their associated increase in power and speed. One application of DSP's is in processing digital signals which are generated on the output of an analog/digital (A/D) conversion device, or for processing digital signals prior to input to a digital/analog (D/A) conversion device. In the A/D converter application, functions such as Finite Impulse Response (FIR) filters have been realized with the DSP, with all filtering performed in the digital domain.

When a DSP is combined with an analog processing device, there exists the possibility for coupling "input pattern dependent" noise from the DSP into the analog processing portion of the device. This pattern dependent noise is the result of making a voltage transition between a logic "0" and a logic "1" at the various nodes in the digital processing section that is signal induced. Since each logic transition due to processing of data in the DSP results in a "signal pattern dependent" set of transitions at the various internal data nodes in the DSP, this can be directly translated into signal pattern dependent variations of the current drawn from the supply voltage. By way of illustration, whenever a circuit, such as an AND gate or an ADDER, changes data from a logic "0" to a logic "1", an internal data node to that circuit goes from a low voltage to a high voltage. Whenever the data node goes from a low voltage to a high voltage, this requires that data node, which has a parasitic capacitance associated therewith, to be charged up, such that it is connected to the power supply node and current is drawn from the power supply node. This results in a di/dt. Since most integrated circuits comprise a die disposed in a package and interconnected to the various pins of the package via bond wires, these bond wires introduce a small amount of series inductance into each lead. It is the di/dt in combination with the inductance that allows coupling between various elements in a system.

In order to reduce pattern dependent noise coupling between circuits, one practice that has been previously implemented is to place a decoupling capacitor as close to a package as possible. This has the effect of removing the external series inductance from the system, thus preventing coupling between adjacent devices via the series inductance. However, this capacitance is difficult to implement internal to the package at the bond pad. Therefore, it is very difficult to remove the coupling of pattern dependence noise due to the series inductance of the bond wires when implementing an analog device in combination with a DSP, either on the same chip or within the same package. Typically, these devices have been restricted to separate packages to allow the pattern dependant noise to be decoupled external to the package. Of course, this type of noise becomes more prevalent as the data rate of the DSP increases, as is the case with an oversampled A/D converter, such as a Delta Sigma based A/D converter.

Of the signals produced in the DSP, the ones that produce pattern dependent noise are those associated with patterns that are not periodic at a multiple of the analog sampling frequency when the DSP is combined with a sampling analog circuit. In general, a periodic clock signal will generate "periodic" noise on the power supply line that can be coupled to the analog processing section. This noise will only constitute an offset in analog sampled circuits, such as a delta-sigma analog modulator, when the noise is due to a periodic signal that is a multiple of the analog sampling frequency of the analog modulator. However, whenever a non-random and non-periodic noise pattern, i.e., pattern-dependent noise, is coupled over to the analog processing section from the digital processing section, this presents more difficulty with respect to eliminating the effect of this noise, as the pattern associated with the pattern-dependent noise will then be impressed upon the analog processing section. Therefore, there exists a need for a technique to periodicitize this type of noise to a multiple of the analog sampling frequency.

Some digital processing circuits do not exhibit any pattern-dependent noise behavior, since they inherently operate with non-pattern dependent data. One type of circuit that operates as such is a latch circuit, which latch circuit can be found in such things as sense amps for a static random access memory (SRAM). In this type of circuit, there are typically two data nodes which are complementary. Each of these data nodes operates at a different logic state. For example, when one logic state goes from a low level to a high level, the other data node will go from a high level to a low level. As such, these types of circuits are inherently pattern-dependent noise free.

SUMMARY OF THE INVENTION

The present invention disclosed and claimed herein comprises a digital processing system for processing digital data. The digital processing system includes a main digital processing circuit that is comprised of a plurality of main logic elements for receiving and processing the digital data to provide a digital output signal. A mirror digital processing circuit is also included that mirrors at least a portion of the main digital processing circuit. The mirror digital processing circuit is comprised of a plurality of complementary logic elements, each of the complementary logic elements corresponding to one of the main logic elements in the portion of the main digital processing circuit. The mirror digital processing circuit is operable to process the complement of the signals processed by the portion of the main digital processing circuit.

In another aspect of the present invention, at least the portion of the main digital processing circuit and the mirror digital processing circuit operate on a return to zero format in a binary system. In this manner, at least one of the logic states in the binary system requires both a positive and a negative transition. Further, the portion of the main digital processing circuit which is mirrored by the mirrored digital processing circuit encompasses substantially all of the main combinatorial logic elements of the main digital processing circuit.

In a further aspect of the present invention, the portion of the main digital processing circuit includes a plurality of main data nodes wherein the main data nodes undergo data transitions during processing of data therethrough. The mirror digital processing circuit has a plurality of complementary data nodes, each corresponding to one of the main data nodes in the portion of the main digital processing circuit. Each of the complementary data nodes undergoes the complement of the data transition on the corresponding one of the main data nodes.

In yet another aspect of the present invention, there is provided a primary digital processing circuit comprised of a plurality of primary combinatorial elements. A complementary digital processing circuit chain is also provided that is comprised of a plurality of complementary logic elements that are each the complement of a corresponding one of the primary logic elements in the primary digital processing circuit. A primary connectivity network is provided for connecting select ones of the primary elements and select ones of the complementary logic elements together in a predetermined digital processing chain for processing the digital data therethrough to provide a digital output signal. A mirrored connectivity network is provided for connecting the remaining ones of the primary logic elements and the remaining ones of the complementary logic elements in a complementary digital processing chain that corresponds to and is the complement of the primary digital processing chain. The complementary digital processing chain is operable to process the complement of the digital data processed by the main digital processing chain.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
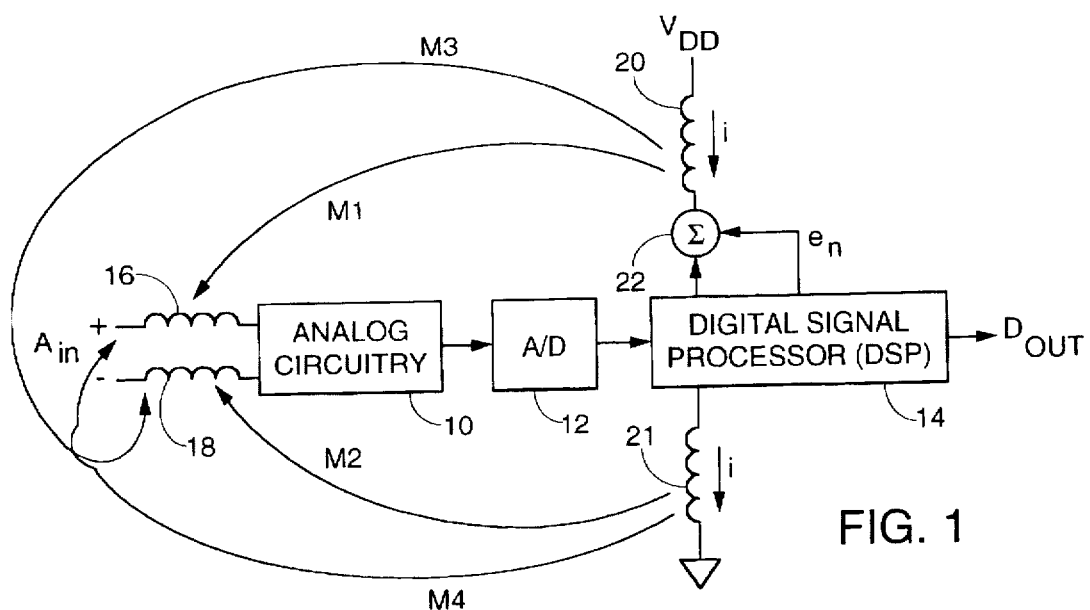
FIG. 1 illustrates a block diagram of a conventional DSP and analog circuitry combination utilizing an A/D converter, wherein the coupling of pattern dependent noise is illustrated.

Referring now to FIG. 1, there is illustrated a block diagram of the system which combines analog processing and digital processing. General analog circuitry 10 is provided which is operable to process low level analog signals. In the circuit illustrated in FIG. 1, an analog/digital (A/D) function is implemented, wherein the analog circuitry is operable to generate an analog signal for input to an A/D converter 12, the output of which comprises a digital stream of data. The A/D converter typically has an oversampled analog modulator that operates at a sampling frequency $f_s$. In the preferred embodiment, an A/D converter 12 utilizes a delta-sigma based A/D converter which provides a one-bit digital stream on the output thereof, this constituting an oversampled A/D converter operating at the sampling frequency $f_s$. This digital stream is input to a digital signal processor (DSP) 14, which DSP 14 is operable to process the single bit digital stream of data output by the A/D converter 12 to provide on the output a digital output thereof a digital signal $D_{OUT}$.

Each of the analog circuitry block 10, the A/D converter block 12 and the DSP block 14 are connected to a power supply $V_{DD}$. The analog circuitry block 10 has the input thereof connected to an analog signal $A_{in}$, a differential signal through a bond wire inductance 16 to the positive side of the analog input and through an inductance 18 to the negative side of the analog input signal. The DSP block 14 is connected to the power supply $V_{DD}$ through a power lead inductance 20 and also to digital ground through a ground lead inductance 21. These lead inductances 16, 18, 20 and 21 are typically a combination of the bond lead inductance and the circuit board interconnection lead inductance. Although not shown, a decoupling capacitor is typically utilized as close to the blocks 10–14 as possible, to decouple any noise on the power supply lead due to the actual circuitry itself In addition to the power supply lead inductances 20 and 21, the DSP 14 also has represented in association therewith a noise summation circuit 22 which is disposed in series with the lead inductance 20 and is operable to allow insertion of a noise parameter $e_n$ in series with the inductance 20, there being a similar structure (not shown) in series with the inductance 21. This noise represents a time varying noise which has a di/dt associated therewith, this being the noise that is generated by the DSP 14 as a result of the internal data nodes being subjected to data transitions. This noise parameter results in a noise parameter in each of the input lead inductances 16 and 18 due to a mutual inductance therebetween. As long as the noise parameter $e_n$ is due to periodic transitions at a multiple of the sampling frequency $f_s$, this noise parameter will merely result in an offset in the analog circuitry 10 and the A/D converter 12, which can be compensated for by providing some type of DC offset. Of course, this will only be the case if the noise parameter is due to periodic data transitions at the data nodes, as would be the case for a clock signal at a multiple of the sampling frequency $f_s$. However, when the noise parameter $e_n$ is the result of pattern dependent data transitions, this results in a detectable noise level in the analog circuitry 10 and A/D converter 12 which can degrade performance.

Figure 2A:
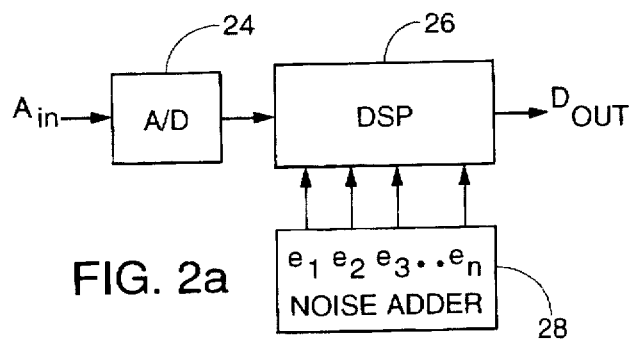
FIGS. 2a and 2b illustrate overall block diagrams of the present invention.

Referring now to FIG. 2a, there is illustrated an overall block diagram of the general concept of the present invention. An analog signal $A_{in}$ is input to an A/D converter block 24. The output of the A/D converter block provides a digital signal for processing with a DSP 26. As described above with reference to FIG. 1, the DSP 26 is operable to generate pattern dependent noise. This pattern dependent noise is the result of a plurality of transitions between a logic "0" and a logic "1" occurring on the various internal data nodes of the DSP 26, each representing a small noise source at that data node. However, these small noise generators related to the pattern dependent noise are not periodic, such that each subcircuit or each circuit element within the DSP 26 does not generate this noise on a periodic basis. If the noise was generated on a periodic basis at a multiple of $f_s$, then the noise would not be pattern dependent.

In accordance with the present invention, a noise Adder device 28 is provided for inserting noise into the system to remove the pattern dependency thereon. This noise is inserted in such a manner as to emulate the situation wherein each data node would have at least a positive transition at every possible transition point, regardless of the state of the data, i.e., noise corresponding to a positive transition would be injected whenever a positive transition did not occur at the data node at a time when a potential positive transition could have occurred. This will insure that the noise associated with each data node emulates that for a periodic signal at that node by ensuring that a di/dt term is introduced for every possible data transition at the time of that possible data transition, it being noted that negative transitions are accounted for. These potential transitions occur at a periodic rate at a multiple of the sampling frequency $f_s$.

Figure 2B:
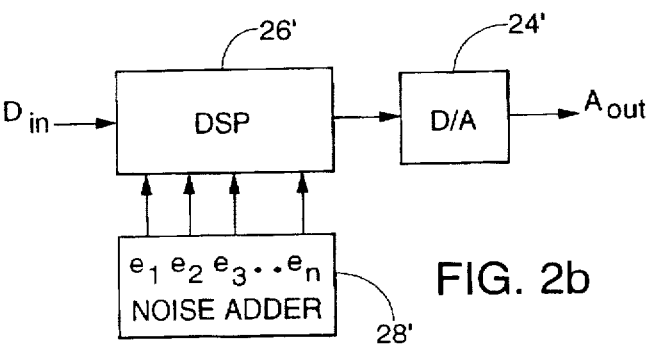

Referring now to FIG. 2b, there is illustrated an alternate embodiment of the embodiment of FIG. 2a for a Digital-to-Analog conversion operation, with the DSP denoted by reference numeral 26' and the noise adder being denoted by the reference numeral 28'. In this embodiment, the DSP 26' is connected to a digital input $D_{in}$ and the digital output connected to the input of a Digital-to-Analog convertor 24'.

Figure 3:
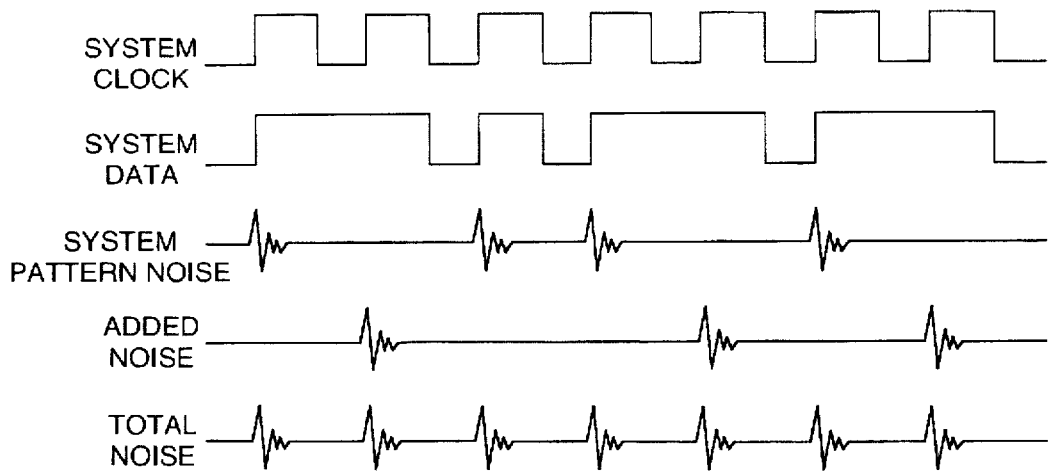
FIG. 3 illustrates timing diagrams for the embodiment of FIG. 2.

Referring now to FIG. 3, there is illustrated a timing diagram for the operation of adding di/dt noise by with the noise adder 28. A system clock is provided illustrating the various transition points, wherein some element in the system could have a positive transition from a logic "0" to a logic "1". Although only the positive transitions are discussed, the negative transitions apply equally as well, there being a negative transition associated with every positive transition. A system data stream is illustrated for a single data node wherein a small di/dt noise component exists for each positive transition, this being illustrated in a system pattern noise plot. It can be seen that the data is such that positive transitions in the system data occur only for positive transitions in the system clock. However, this may not be the case in an actual system utilizing combinatorial logic. For the illustrated example, however, the system data could have a positive transition for each positive transition of the clock, the positive transitions of the clock therefore defining the set of potential positive transition at the data node. If this were the case, however, then the system data would be a periodic clock signal. In order to periodicitize the noise that exists in the system pattern noise, the added noise is essentially added at each positive transition of the system clock wherein there was no positive transition in the system data. It can be seen in the lower timing diagram labeled "TOTAL NOISE" that the noise is now periodicitized, and therefore, it is not pattern dependent. The illustration of FIG. 3 is for only a single data node, it being understood that each data node must be periodicitized with respect to its noise.

Figure 4:
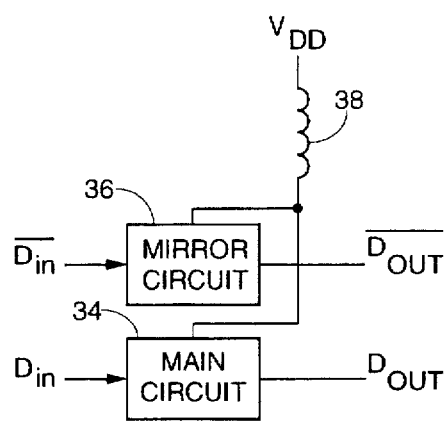
FIG. 4 illustrates a block diagram of one embodiment of the present invention utilizing mirror circuitry.

Referring now to FIG. 4, there is illustrated an overall block diagram of the preferred embodiment of the present invention. The digital processing system that is illustrated is comprised of a main circuit 34 and a mirror circuit 36. The main circuit 34 is the conventional circuit utilized to process a digital input value $D_{IN}$ and provide an output digital value $D_{OUT}$. For each and every circuit in the main circuit 34, the image thereof is provided in the mirror circuit 36, which is connected to the complement digital input $D_{IN}$-Bar. Therefore, whenever a logic "1" is generated on a data node in any circuit element in the main circuit 34, a complementary logic "0" value is generated in a corresponding data node in the mirror circuit 36. Conversely, whenever a logic "0" is generated in any data node in a circuit element in the main circuit 34, the corresponding data node in complementary circuit to that circuit in the mirror circuit 36 has a logic value "1" associated therewith. For example, whenever a transition between a logic "0" and a logic "1" occurs in a given data node in a given circuit element in the main circuit 34, the current through a power lead inductance 38 from the power terminal will undergo a di/dt. However, when no transition occurs therein for that data node, additive noise in the form of di/dt noise is not introduced to the power supply for that data node. However, the corresponding data node in the mirror circuit 36 undergoes a transition, thus providing the necessary di/dt noise to emulate di/dt noise for a periodic signal for that data node.

Whenever two logic "1s" occur in sequence in the main circuit 34, this results in the occurrence of two logic "0s" in sequence in the mirror circuit 36. In order to insure that the occurrence of a logic "1" has associated therewith a positive transition in either the main circuit 34 and the mirror circuit 36, but not both, even in the event that two logic "1s" occur in sequence, it is necessary to insert a "0" transition between each two logic states in both the main and mirror circuits. For a logic "1", this will result in the data value making a positive transition, followed by a negative transition. If this is followed by another logic "1", this will be followed by another positive transition. Therefore, each logic "1" state is insured to have a positive transition. This is referred to as a Return-to-Zero (RZ) data, which is a conventional data technique. Alternatively, a logic "1" could be inserted, the point being that, whenever a state change occurs, one and only one of the paired nodes will undergo a transition.

Figure 5:
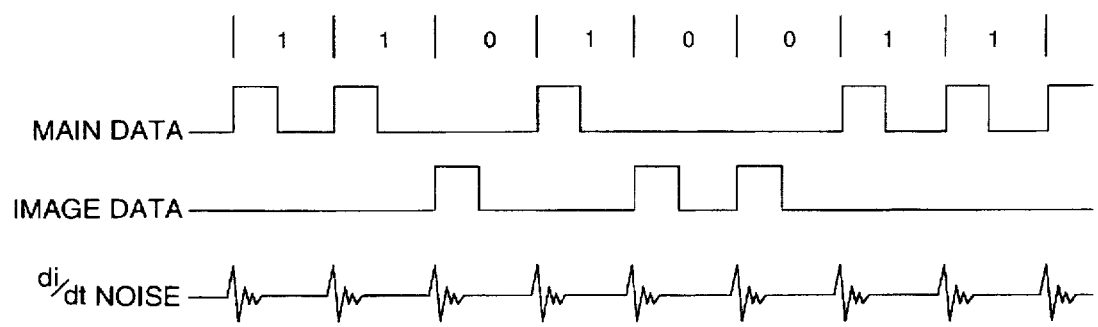
FIG. 5 illustrates a timing diagram wherein RZ data is utilized for the embodiment of FIG. 4.

Referring now to FIG. 5, there is illustrated a timing diagram for a single circuit element within the main circuit 34 having Main Data processed therethrough and a corresponding mirror circuit element within the mirror circuit 36 having Image Data processed therethrough. The Main Data and the Image Data are illustrated in FIG. 5. It can be seen that the sequence of data is comprised of a portion of a data stream representing the logic string "11010011" for the Main Data. The Image Data would be the complement, or "00101100". Each logic "1" value is realized with an RZ data stream having a positive transition followed by a negative transition. The positive transition occurs at the beginning of a data cycle or data cycle, such that a low voltage level precedes the data cycle followed by a high voltage level at the beginning of the data cycle for a logic "1". A negative transition is then inserted in the form of a reset value to again lower the voltage level at some point in the middle of the data cycle, such that the end of each data cycle, the voltage level is low. Whenever a logic "1" is followed by a logic "0", the voltage level remains low. As will be described hereinbelow, each data cycle has a reset circuit associated therewith in the middle of the cycle to reset the voltage level to a low voltage level. For a logic "0", of course, the voltage level is already low and, therefore, no effect on the voltage level is seen.

It can be seen that each logic "1" data bit in the Main Data stream has a positive transition associated therewith, even when two sequential logic "1s" occur. However, when a logic "0" follows a logic "0", the voltage remains low and no transition occurs at the boundary between the two data cycles. This is the point at which noise must be added to the system by the mirror circuit 36. Therefore, the Image Data stream must add a transition at this boundary. This is achieved by merely generating a logic "1" value whenever a logic "0" value is present in the main circuit 34. The di/dt noise then comprises the sum of all the transitions for both the data nodes in the main circuit 34 and the corresponding mirrored or imaged data nodes in the mirror circuit 36. Again, it should be noted that the timing diagram of FIG. 5 is for only a single data node wherein a logic state change occurs at the single data node, and for each node in the main circuit 34 that undergoes a positive transition. Whenever a logic "1" state is present on any data node in the main circuit 34 that provides a positive transition, there must be a corresponding data node in the mirror circuit 36 with a logic "0" associated therewith that provides no transition.

In FIG. 4, the mirror circuit 36 has replicated therein the image circuit for each node in each circuit element in the main circuit 34. As such, the amount of circuitry has effectively doubled. The data will be input to the main circuit 34 and the complement data will be input to the mirror circuit 36. The output of the main circuit 34 will be $D_{OUT}$. The mirror circuits process will be the complement operation such that the output will be $D_{OUT}$-BAR. For example, a Full Adder circuit implemented in the main circuit 34 may output a value "11010011". The output from the corresponding Image Circuit Full Adder would be "00101100". The detail of these circuits will be described in more detail hereinbelow.

Figure 6:
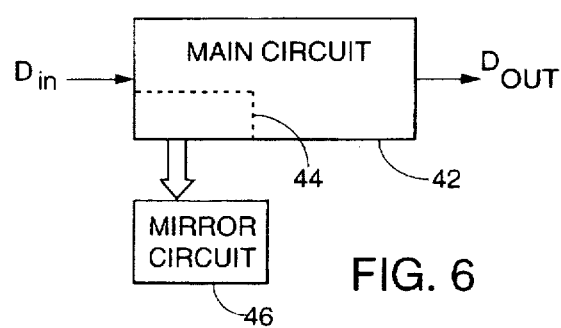
FIG. 6 illustrates an alternate embodiment of the present invention wherein only a portion of the main circuit is mirrored or imaged.

Referring now to FIG. 6, there is illustrated an alternative embodiment wherein a main circuit 42 is provided which is a digital signal processing circuit operable to process a digital input value $D_{IN}$ and provide on the output thereof a digital output value $D_{OUT}$. However, only a portion 44 of the main circuit 42 is mirrored in a mirror circuit 46. This portion 44 may be that determined to provide the bulk of the pattern dependent noise and, as such, for the purpose of reducing the amount of circuitry required in the mirror circuit 46, only this portion 46 is imaged. This may be sequential nodes or it may just be select nodes.

Figure 7A:
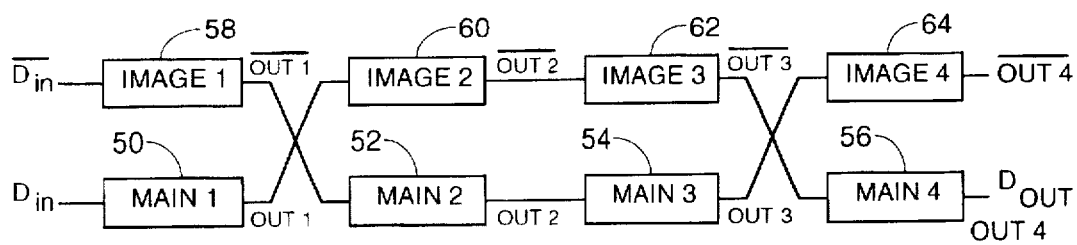
FIGS. 7a and 7b illustrate block diagrams of an embodiment wherein both the image circuitry and the non-image circuitry are utilized in the processing of digital signals.

Referring now to FIG. 7a, there is illustrated an alternate embodiment of the present invention. In any DSP, the digital processing of the data may require that the complement of a given output and that output then utilized in the processing. This complement is usually obtained by using a bank of inverters. However, since the image circuitry is present and naturally provides the complement as the output, circuit reduction can result if the complement value generated by the image circuitry is utilized for the processing operation, since no inverters are needed.

In the embodiment of FIG. 7a, there are four sections defined in the circuitry, four main sections 50, 52, 54 and 56 for the main digital processing circuitry and four corresponding mirror sections 58, 60, 62 and 64 to provide the image circuitry. The interconnection illustrated in FIG. 7a requires the main section 50 having the output thereof connected to the image section 60, the output of the image section 60 connected to the image section 62, and the output of the image section 62 connected to the main section 56. The output of the main section 56 results in the processed digital output value $D_{OUT}$. Therefore, the data is actually processed through the main section 50, the image section 60, the image section 62 and the main section 56. However, in order to provide the image function, the data must also be processed through image section 58, the main section 52, the main section 54, and the image section 64. The same result could be obtained by interspersing any type of complement generating circuit between the main section 50 and 52 and also between the main sections 54 and 56. However, a corresponding image complement circuit would need to be disposed between the image section 58 and the image section 60, and also between the image section 62 and the image section 64.

Figure 7B:
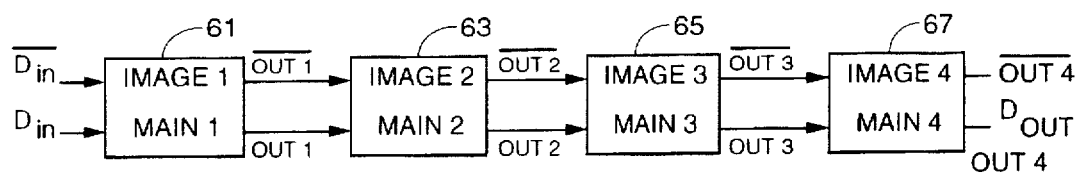

Referring now to FIG. 7b, there is illustrated a block diagram of an embodiment wherein the image circuitry and the main circuitry are combined. There are illustrated four integrated logic blocks, block 61, block 63, block 65 and block 67, all connected in series. each of the blocks 61, 63, 65 and 67 receive both the output and the complement thereof from the previous block, with the first block 61 receiving the inputs $D_{IN}$ and $D_{IN}$-Bar. This integrated structure will be described in more detail hereinbelow.

Figure 8A:
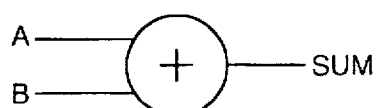
FIGS. 8a and 8b illustrate the image and non-image circuitry for an Adder circuit utilized for an additional operation.

DSPs utilize various registers, multiplexers, logic gates, Half Adders and Full Adders to perform the digital processing function. If a Full Adder, by way of example, receives inputs A and B and the carry input value $C_{IN}$, this will result in the output SUM. The question would then be whether a Full Adder in the image circuitry would be able to receive the complement values A-Bar, B-Bar and the carry input value $C_{IN}$-Bar and provide on the output thereof the value SUM-Bar. This is illustrated in FIG. 8a and in FIG. 8b, with FIG. 8a illustrating the addition operation in the main circuit and the complementary function illustrated in FIG. 8b. If, for the general case, we provide a 12-bit data stream, then the complementary function in FIG. 8b will be the value X, wherein it will be determined whether the value X will equal the complement of SUM. The relationship is as follows:

$$X = \bar{A} + \bar{B} + \bar{C}_{in} = (FFF - A) + (FFF - B) + 1 \quad (1)$$

$$X = (FFF + FFF + 1) - (A + B) \quad (2)$$

$$X = FFF - (A+B) = FFF - SUM = SUM\text{-Bar} \quad (3)$$

Figure 8B:
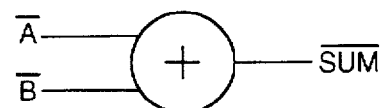
Figure 9A:
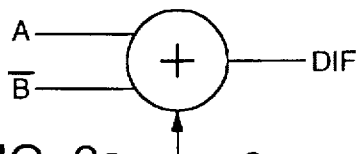
FIGS. 9a and 9b illustrate the image and non-image circuit for an ADDER utilized for a subtraction operation.
Figure 9B:
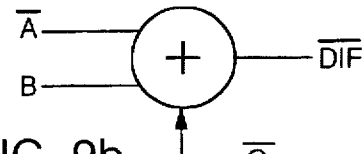

It can therefore be seen that the Image Adder of FIG. 8b will in fact perform an image addition equal to the addition formed by the configuration of FIG. 8a. With respect to image subtraction, this is illustrated in FIG. 9a, wherein subtraction is performed by the 2's complement wherein the inputs to the Adder are A and B-Bar with $C_{IN}=1$ and the output is the value DIF. In the image subtraction device of FIG. 9b, the inputs are A-Bar, B, and $C_{IN}$-Bar with the output being DIF-Bar. If we assume that the output of the Image Subtraction Adder of FIG. 9b is Y, the following equations will illustrate that the image subtraction can be performed.

$$Y=\bar{A}+B+\bar{C}_{in}=(FFF-A)+(FFF-\bar{B})+0 \quad (4)$$

$$Y=(FFF+FFF+1)-(A+B+1) \quad (5)$$

$$Y=FFF-DIF=DIF\text{-Bar} \quad (6)$$

Whenever a register is realized with RZ data, it is necessary to reset the register every cycle without losing data, i.e., for every cycle. Since the register is realized with a master/slave configuration, it is necessary to reset the master and the slave stage at different times to allow the insertion of a zero into every data cycle for both the master and the slave portions of the register.

In addition to the Full Adder structure, each and every element having a data node that can make a transition from a logic "1" to a logic "0" or from a logic "0" to a logic "1" is implemented in its complementary form. Therefore, for each data node in the main digital processing circuit having any such logic transition, its complementary data node is implemented in the image path. As such, this insures that for any data cycle, there will be a logic transition.

Figure 10:
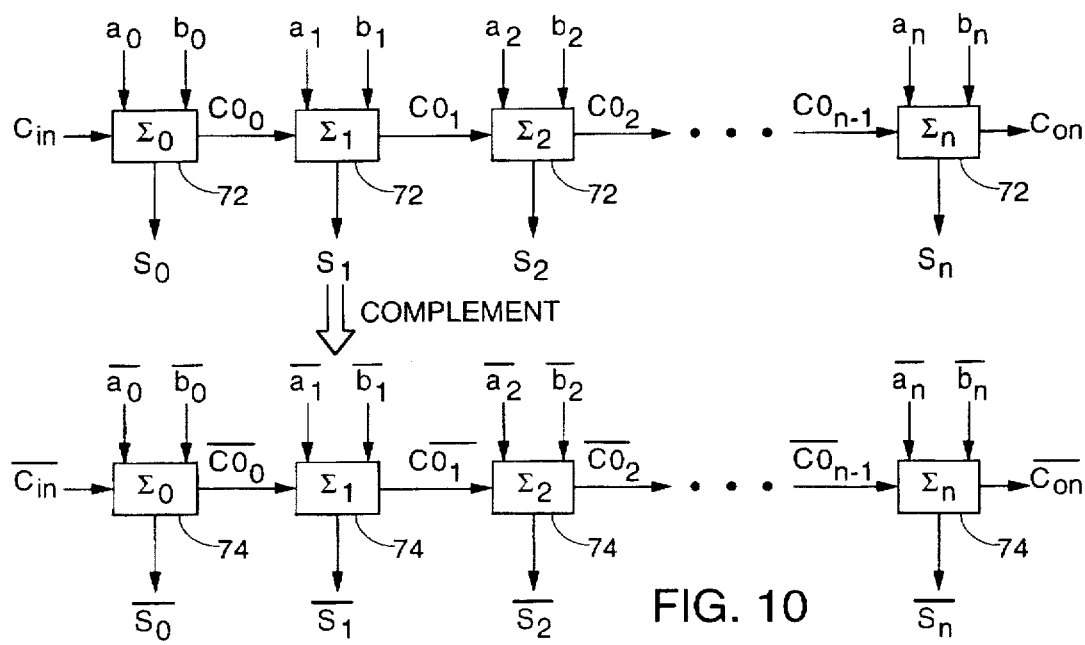
FIG. 10 illustrates a diagrammatic view of a plurality of chained Full Adder blocks and the complement thereof.

Referring now to FIG. 10, there is illustrated a block diagram of a Full Adder chain wherein the carry-out is rippled through the chain. This is a conventional structure. However, the block diagram of FIG. 10 illustrates the complement path at a complement structure in the image path. In a conventional manner, the carry chain is comprised of a plurality of Full Adder structures 72, each having two data inputs for receiving one of multiple inputs $a_o$–$a_n$ and another input for receiving one of multiple inputs $b_o$–$b_n$. Additionally, each Full Adder structure has a summation output $S_0$–$S_n$, one of which is associated with each of Full Adder structures 72. Each Full Adder structure 72 also receives a carry input and provides a carry output. When chained together, the first Full Adder structure associated with the summation output $S_0$ has the carry output therefrom connected to the carry input of the next Full Adder structure associated with the summation output $S_1$.

The chained Full Adder structure utilizing the Full Adders 72 has the complement thereof formed in the image path. The complement structure utilizes a plurality of Full Adders 74, chained together to from a complement Full Adder structure. However, each of the Full Adders receives the complement input to the corresponding Full Adder structure 72 in the main path. Additionally, the carry input and the carry output of each of the Full Adder structures 74 is the complement of the associated Full Adder structure 72. Therefore, each of the Full Adder structures 74 receives on input thereof multiple inputs $a_o$-Bar, -$a_n$-Bar and input $b_o$-Bar -$b_n$-Bar. The output of each of the Full Adder structures comprises a complement of the outputs of the Full Adder structure 72, or $S_o$-Bar-$S_n$-Bar.

Figure 11:
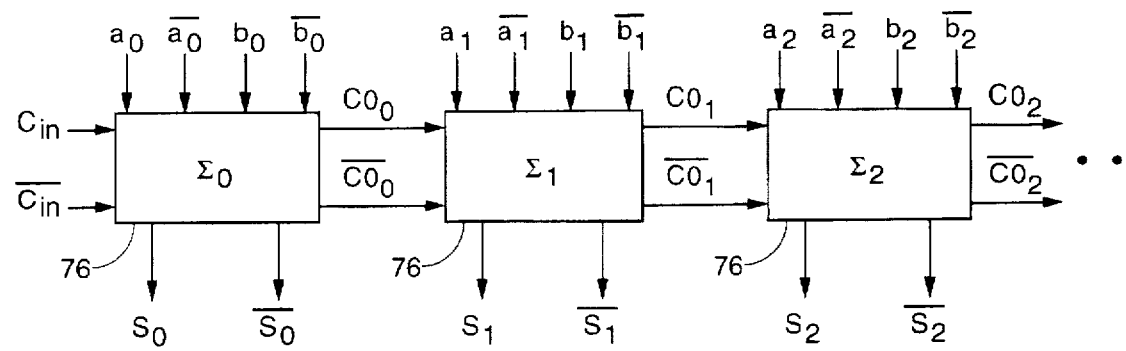
FIG. 11 illustrates a diagrammatic view of a chained Full Adder with an integrated complement chain.

Referring now to FIG. 11, there is illustrated an integrated Full Adder structure wherein the complementary structures are integrated into each Full Adder structure. A plurality of Full Adder structures 76 are illustrated, each for receiving an associated one of the inputs $a_o$–$a_n$, $a_o$-Bar-$a_n$-Bar, $b_o$-$b_n$ and $b_o$-Bar-$b_n$-Bar. In addition, each of the Full Adder structures 76 receives a carry input and a complement thereof and provides a carry output and the complement thereof. Additionally, both the summation output $S_o$–$S_n$ and a complement thereof, this will be described in more detail hereinbelow.

Figure 12:
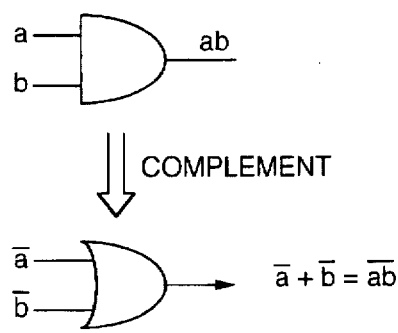
FIG. 12 illustrates the complementary structure of an AND gate.
Figure 13:
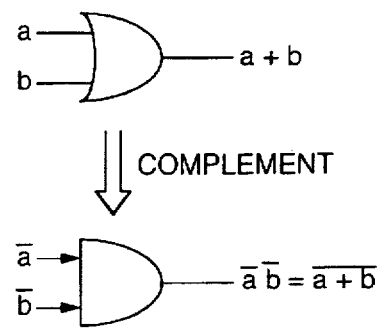
FIG. 13 illustrates the complementary structure of an OR gate.

Referring now to FIG. 12, there is illustrated the complement structure of an AND gate which is an OR gate that receives the complement of the corresponding inputs to the AND gate. For example, an AND gate would receive an inputs a and b and provide on the outputs the AND relationship a·b. The corresponding complement output would be (a·b)-Bar. This is realized with an OR gate having the inputs a-Bar and b-Bar which provides on the output a logic relationship a-Bar+b-Bar which is equal to (a·b)-Bar, the complement of the AND gate structure. Similarly, FIG. 13 illustrates that an AND gate is the complement of an OR gate wherein the OR gate receives the inputs a and b and provides on the output the relationship a+b. The AND gate, when it receives complementary inputs a-Bar and b-Bar, provides on the output thereof the relationship a-Bar·b-Bar which is equal to the relationship (a+b)-Bar, the complement of the OR gate output.

Figure 14A:
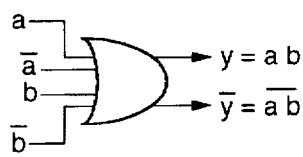
FIGS. 14a and 14b illustrate the integrated complementary structure of the AND and OR gates.

Referring to FIG. 14a, there is illustrated the integrated AND gate which provides both the AND gate function and the complement AND gate function. However, for this function, the inputs must be comprised of both the inputs a and b and also the inputs a-Bar and b-Bar. This provides on the outputs the Y-output and the Y-Bar output, the same structure as illustrated in FIG. 12.

Figure 14B:
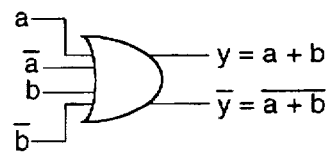

FIG. 14b illustrates the integrated complement structure for the OR gate, wherein the OR gate receives as inputs the inputs a and b and the inputs a-Bar and b-Bar. The output provides both the Y and the Y-outputs. These will be described in more detail hereinbelow.

Figure 15:
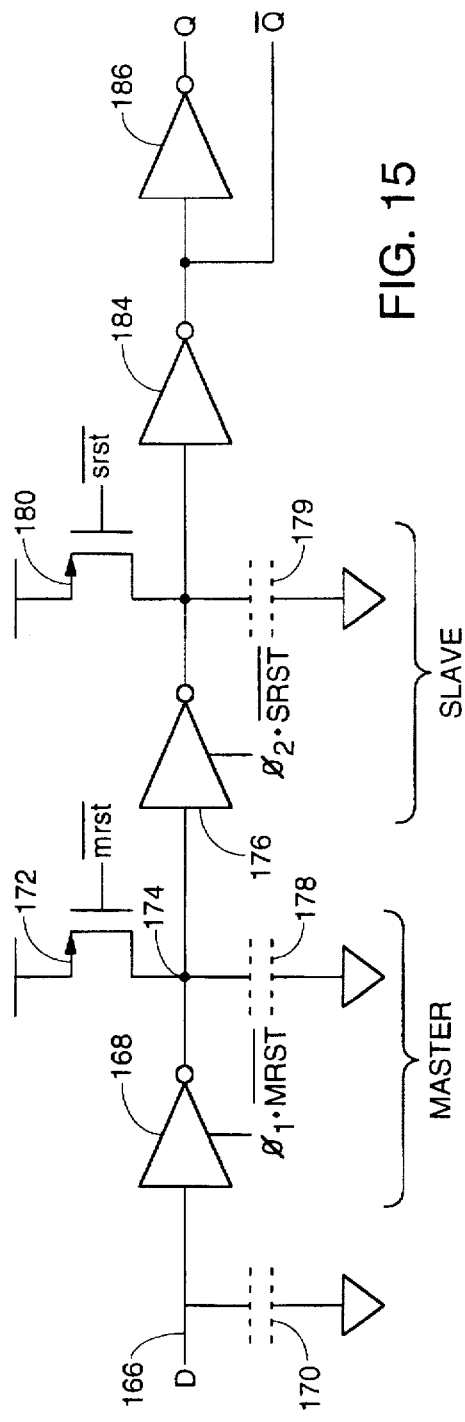
FIG. 15 illustrates a block diagram of a master/slave register.

Referring now to FIG. 15, there is illustrated a logic block diagram of a master/slave register. Data is input on a node 166 which is connected to the input of a latch 168. Latch 168 is controlled by a timing signal $\phi_1$·mrst-Bar. The node 166 is also connected to one side of a parasitic capacitor 170, the other side thereof connected to ground. The output of the latch 168 is connected to a node 174 and through the source/drain path of a P-channel transistor 172. The gate of the P-channel transistor 172 is connected to a master reset signal mrst-Bar. The latch 168, the transistor 172 and the capacitor 170 form the master side of the register.

The node 174 is connected to the input of a slave latch 176. Node 174 is also connected to one side of a parasitic capacitor 178, the other side thereof connected to ground. The output of the latch 176 is also connected through the source/drain path of a transistor 180 to the supply voltage, the gate of transistor 180 connected to the slave reset signal srst-Bar, there being a parasitic capacitor 179 connected between the output of the latch 176 and ground. The latch 176 is controlled by the timing signal $\phi_2$·srst-Bar. The latch 176, the capacitor 178 and the transistor 180 comprise a slave portion of the register. The output of latch 176 is connected to the input of an inverter 184, the output of which provides the register output Q-Bar. The output of inverter 184 is also output to the input of an inverter 186, the output of which provides the output signal Q.

Figure 16:
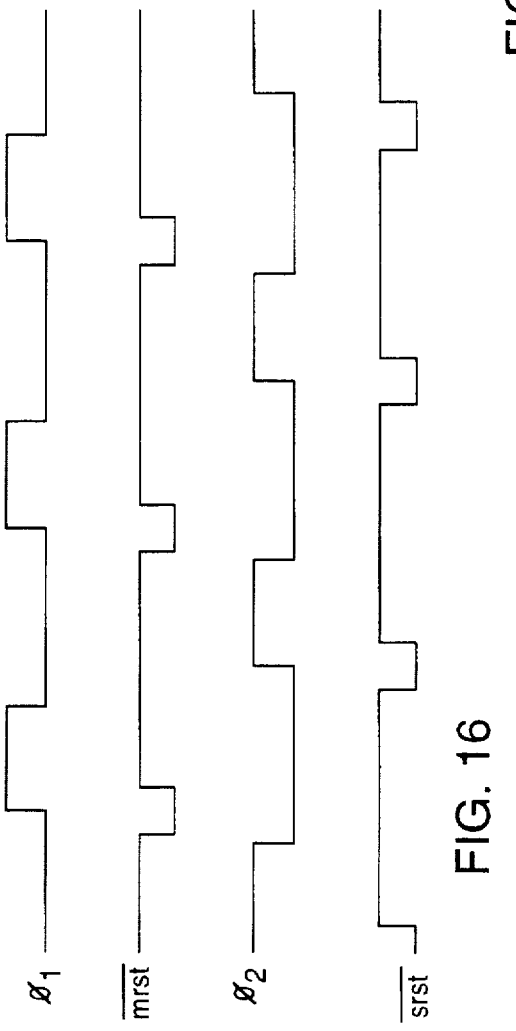
FIG. 16 illustrates the timing diagrams for the register of FIG. 10.

The timing diagrams for the operation of the register are illustrated in FIG. 16. It can be seen that the reset signal for the master portion occurs right before the latch 168 actually captures data. This would effectively intersperse a zero into the master latch, even in the event that the master latch was presented with a logic "1" value in successive cycles or bit fields. This would therefore force a transition from a zero level to a high level. Similarly, the reset operation of transistor 180 also intersperses a zero into the operation of the slave latch 176 right before the slave latches data from the master section. Latching behavior of subsequent stages is not affected by this operation. Other operations of the register will be described in more detail hereinbelow.

When the implementation of a ripple carry Full Adder is considered, one must consider the case wherein the Full Adder is implemented in a chain of Full Adders. In this case, all three inputs to every Full Adder, the A input, the B input and the $C_{IN}$ input are necessary to realize the zero insertion function. One aspect to consider is that the carry out value will ripple through the chain and cause intermediate uncontrollable transitions, this being a combinatorial logic device with a plurality of unknown transitions during this ripple operation. These transitions can not be compensated for in the image path alone. Unless these transitions are considered, some noise will exist. In order to prevent these intermediate transitions, and thus achieve noise invariance, it is necessary to first detect the "done" state of the preceding Full Adder or register and then reset the present Full Adder until the previous one reaches its done state. In order to detect the done state of each Full Adder, it is only necessary to realize one aspect of both the Full Adder and the Image Full Adder; that is, that its Carry-Out and its image Carry-Out are always equal to zero during the reset period. It is only after the reset period that the inputs of the Image Full Adder are the complement of the inputs to the Full Adder. Therefore, during the reset, the Carry-Out and the image Carry-Out are the same, and after the reset, the Carry-Out and the image Carry-Out are the complement of each other. Using this relationship, one can then detect the done state of each preceding Full Adder generating a reset value $rst_i$ for the present full adder as follows:

$$rst_i = (\overline{Co}_{i-1} + Co_{i-1})\text{-Bar} \quad (7)$$

This relationship results in $rst_i$ being equal to the value of "1" for the insertion of the zero, i.e., when the Carry-Out and the image Carry-Out are both equal to zero. After reset, the Carry-Out and the image Carry-Out will then change, depending upon the actual output of the Full Adder. When they are the complement of each other, then the Full Adder and the Image Full Adder have reached their "done" state. This will prevent one Full Adder from affecting the other Full Adder as a result of the carry ripple through.

Figure 17:
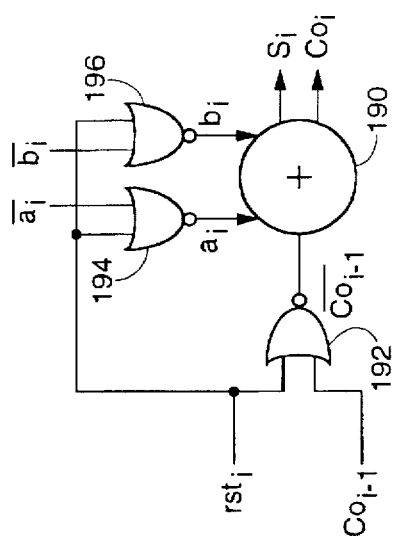
FIG. 17 illustrates a block diagram of a Full Adder with zero insertions.

Referring now to FIG. 17, there is illustrated a diagrammatic view of a Full Adder with resets. A Full Adder 190 is provided having two inputs $a_i$ and $b_i$ and a carry input from the previous adder $Co_{i-1}$. Two outputs are provided, a Sum output $S_i$ and a Carry output, $Co_i$. The carry input to the adder 190 is connected to the output of a two input NOR gate 192, one input of which is connected to the inverse Carry-Out of the previous stage, $Co_{i-1}$-Bar and the other input thereof connected to the reset signal $rst_i$. Similarly, the $a_i$ input of the adder 190 is connected to the output of the two input NOR gate 194 and the $b_i$ input is connected to the output of a two input NOR gate 196. One input of both gates 194 and 196 are connected to the $rst_i$ signal. The other input of the NOR gate 194 is connected to the $a_i$-Bar input and the other input of the gate 196 is connected to the $b_i$-Bar input.

If $a_i$ and $b_i$ are provided by a register and the two phases used in the register are as described above with reference to FIG. 16, it will be necessary to determine when the bits are latched by the appropriate registers, i.e., when $\phi_2$ is equal to zero. This will therefore result in the following relationship:

$$rst_i = \phi_2 + (\overline{Co}_i + Co_{i-1})\text{-Bar} \quad (8)$$

This relationship will result in the value of $rst_i$ being equal to a high value when $\phi_2$ is high or when the previous Full Adder has not reached its done state. In this manner, all intermediate transitions are eliminated or accounted for.

Figure 18:
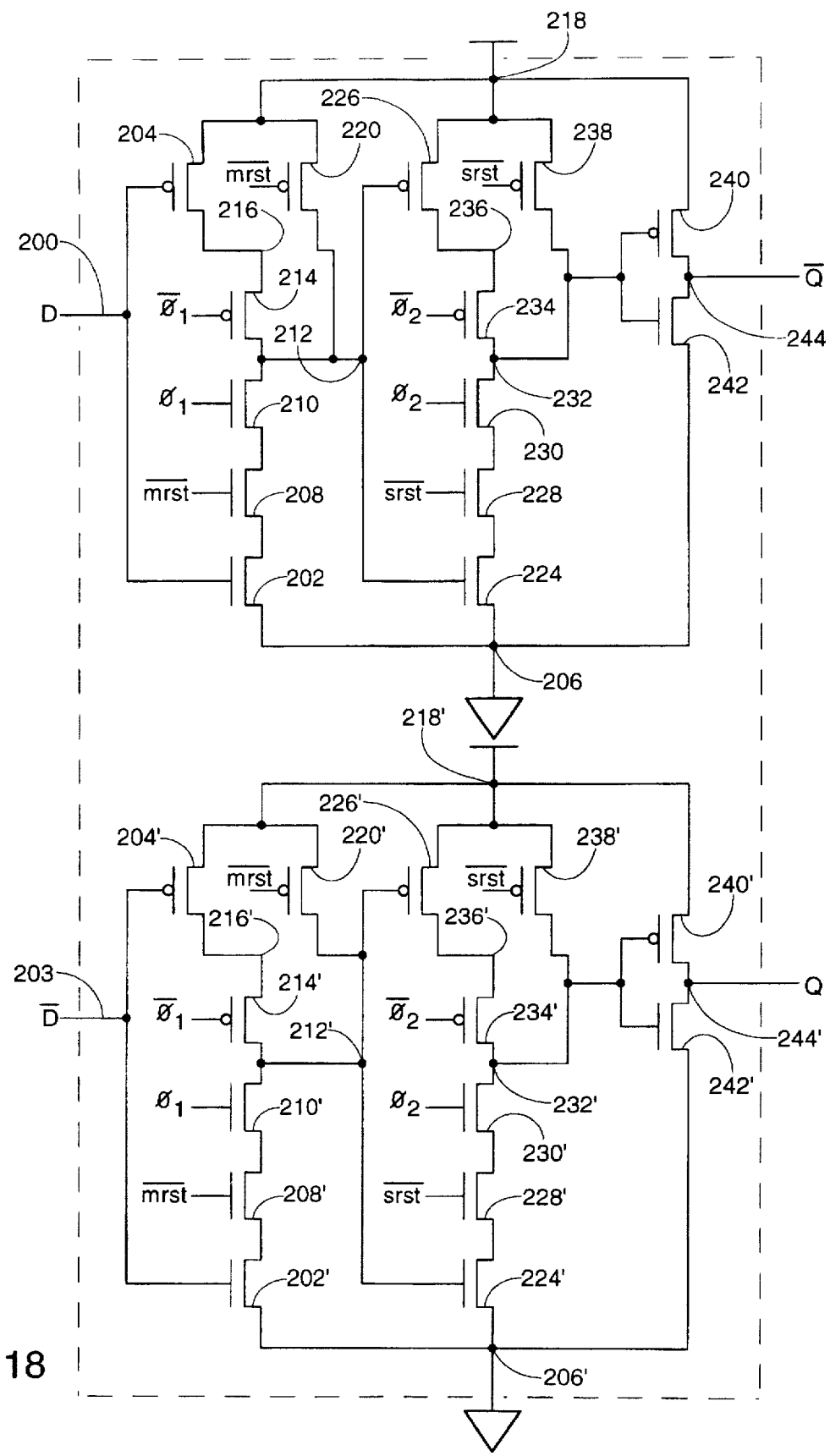
FIG. 18 illustrates a schematic diagram of the register with an integrated complement structure.

Referring now to FIG. 18, there is illustrated a detailed schematic diagram of the integrated register. The register is configured such that it both receives data on an input line 200 and data-Bar on line 203. This allows both the main data path and the image data path to be accommodated. Associated with the data on line 200 is a main data section which provides on the output thereof the output Q-Bar. Similarly, the image section is associated with the data-Bar line 203 and provides on the output thereof a signal "Q". The register is designed such that, in operation thereof, both the data and the complement thereof are received as inputs and both the output Q and the complement thereof are provided as outputs. The zero insertion is provided in both the main section and image section with the reset signals mrst-Bar and srst-Bar. Each circuit will therefore have a positive transition from a low level to a high level for each cycle or bit field.

The data line 200 is input to the gate of an N-channel transistor 202 and the gate of a P-channel transistor 204. The transistor 202 has the source/drain path thereof connected between the ground node 206 and one side of the source/drain path of an N-channel transistor 208, the gate thereof connected to the reset signal mrst-Bar. The other side of the source/drain path of transistor 208 is connected to one side of the source/drain path of an N-channel transistor 210, the gate thereof connected to the timing signal $\phi_1$. The other side of the source/drain path of transistor 210 is connected to a latched node 212. A P-channel transistor 214 has the source/drain path thereof connected between the node 212 and a node 216, the gate of transistor 214 connected to the timing signal $\phi_1$-Bar. The P-channel transistor 204 has a source/drain path thereof connected between the node 216 and a power supply node 218. A P-channel transistor 220 has a source/drain path thereof connected between the power supply node 218 and the node 212, and the gate thereof connected to the reset signal mrst-BAR.

The latched data node 212 is connected to the gates of N-channel transistors 224 and 226, the source/drain path of transistor 224 connected between the ground node 206 and one side of the source/drain path of an N-channel transistor 228. The gate of transistor 228 is connected to the reset signal srst-Bar and the other side of the source/drain path thereof is connected to one side of the source/drain path of an N-channel transistor 230, the gate thereof connected to the timing signal $\phi_2$. The other side of the source/drain path of transistor 230 is connected to a latched data node 232. A P-channel transistor 234 has the source/drain path thereof connected between node 232 and a node 236, the gate of transistor 234 connected to the timing signal $\phi_2$-Bar. The P-channel transistor 226 has the source/drain path thereof connected between the node 236 and the power supply node 218. The P-channel transistor 238 has the source/drain path thereof connected between the node 232 and power supply node 218. The data node 232 comprises the output data and it is operable to drive the gates of two series connected transistors, a P-channel transistor 240 and an N-channel transistor 242, having a source/drain path thereof connected together at a common output node 244 providing the output Q-BAR. The other side of the source/drain path of transistor 240 is connected to the power supply node 218 and the other side of the source/drain path of transistor 242 is connected to the ground node 206.

The image portion is identical to the main portion, with the exception that the reference numerals, are "primed", it being understood that the power supply terminal 218 in the main section is the same node as the power supply node 218 in the image section, and the ground node is the same node as the ground node in the image section. The output node 244' provides on the output thereof the output Q and the data node 202 is input to the gates of P-channel transistor 204' and the N-channel transistor 202'.

In operation, and referring to the timing diagram of FIG. 16, when $\phi_1$ goes high and $\phi_1$-Bar goes low, transistors 210 and 214 conduct. When data is a logic "1" on line 200, transistor 202 is turned on and pulls node 212 low. This in turn pulls the gate of transistor 226 low. However, since $\phi_2$-Bar is high, transistor 234 is open and current is not drawn from the power supply node 218. However, if the data on line 200 is a logic "0", i.e., a low voltage level, data node 200 is pulled low, turning on transistor 204. Transistor 204 then pulls node 212 high, drawing current from the power supply node 218 to charge up the node 212, assuming that the node 212 were previously disposed at the low logic level. When the mrst-Bar signal goes low, transistor 208 is rendered non-conductive and transistor 220 conducts to insure that node 212 is pulled high and current is drawn through transistor 220 from the power supply node 218. This provides the insertion of a zero into the master side of the register.

Thereafter, transistor 208 is again rendered conductive and transistor 220 rendered non-conductive, and a logic "1" on data node 200 will again pull node 212 low when $\phi_1$ again goes high and $\phi_1$-Bar goes low. The data value is "latched" at the node 212, where $\phi_1$ again goes low and $\phi_1$-Bar goes high, this being the master latch node. For the image portion of the register, a reset operation on the master side of the main portion will result in current being pulled from node 218 to node 212 or no current being pulled. If current is pulled from node 218 to charge up node 212, in the main section, no current will be conducted through transistor 220' to charge up node 212', in the image section, as node 212' is already at the opposite level as node 212. Conversely, when current is not drawn through transistor 220 during a reset option in the main section, current is drawn through transistor 220' in the image section to charge up node 212' during the reset operation.

On the slave side of the register, the latched level on node 212 will either turn on transistor 226 or turn on transistor 224, depending upon the level. When the voltage level on node 212 is high, transistor 224 is turned on and, during the time that $\phi_2$ is high and $\phi_2$-Bar is low, node 232 will either be pulled to the ground node level through transistor 224 or pulled high through transistor 226. During the initial portion of $\phi_2$, the reset signal srst-Bar is low, such that transistor 238 is turned on and transistor 228 is turned off. This will force node 232 to be pulled high, even if the previous state was low. If node 232 was previously at a low level, current will be drawn through transistor 238 causing a di/dt transition in the power supply line. However, no di/dt transition will be added as a result of transistor 238' being turned on in the image section. If node 232 were at a high level previous to the reset signal, srst-Bar, then no pattern dependent noise would be added in the main section and current will be drawn through transistor 238' to pull node 232' high. It can therefore be seen that the zero is inserted in both the master and the slave side of the main section and image section without loss of data.

As a summary of the operation of the register FIG. 18, it is necessary to understand that the master and the slave sides generally have three states, a reset state, a pass data state and a latch data state. Specifically for the master, when mrst-Bar is equal to a "0" value, it is at the reset state. This state ignores any data input on the line 200 or on the line 203, resulting in a logic "1" insertion at the node 112 and 112', i.e., both nodes are pulled high. When the value of mrst-Bar is equal to "1" and the value of $\phi_1$ is equal to "1", the register is then at the pass data state. When the value of mrst-Bar is equal to "1" and the value of $\phi_1$ is equal to "0", the register is at the latch data state. Similar states will appear in the slave portion of the register. The sequence of operations will therefore be, first, a reset state of the master, second, the pass data state of the master, third, the latch state of the master, fourth, the reset state of the slave, fifth, the pass data state of the slave, and, sixth, the latch state of the slave. It is noted that when the slave is in the pass data state, the master is still at the latch state. This is the reason that both the master and the slave can be reset without losing data.

Figure 19A:
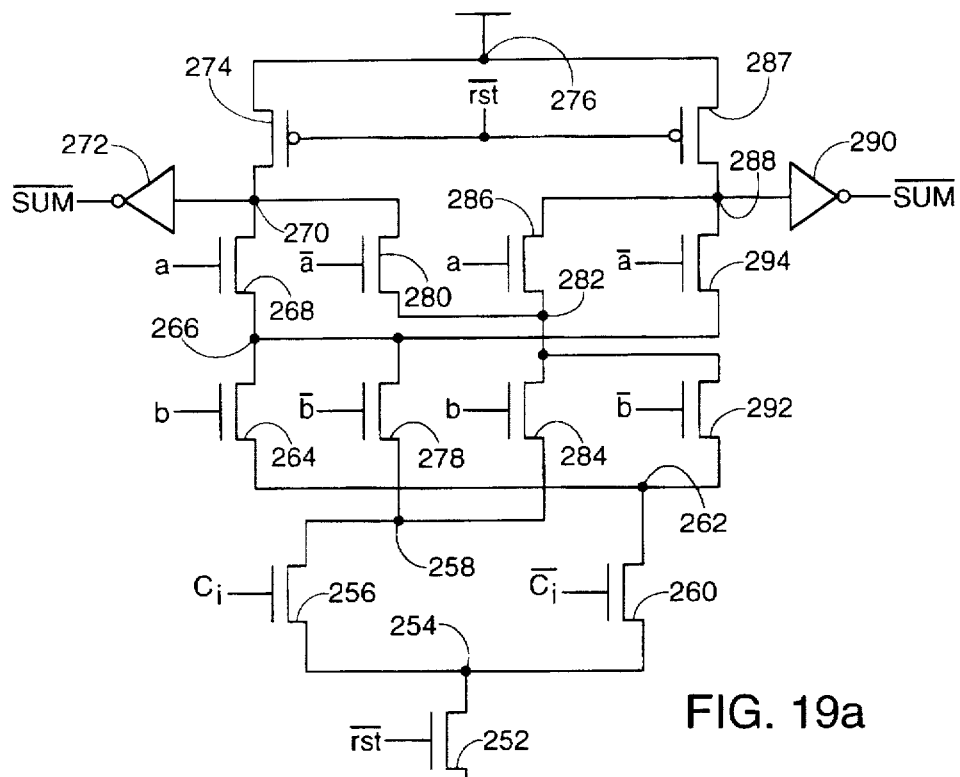
FIG. 19a illustrates a schematic diagram of the SUM portion of the dynamic Full Adder with an integrated complement structure.
Figure 19B:
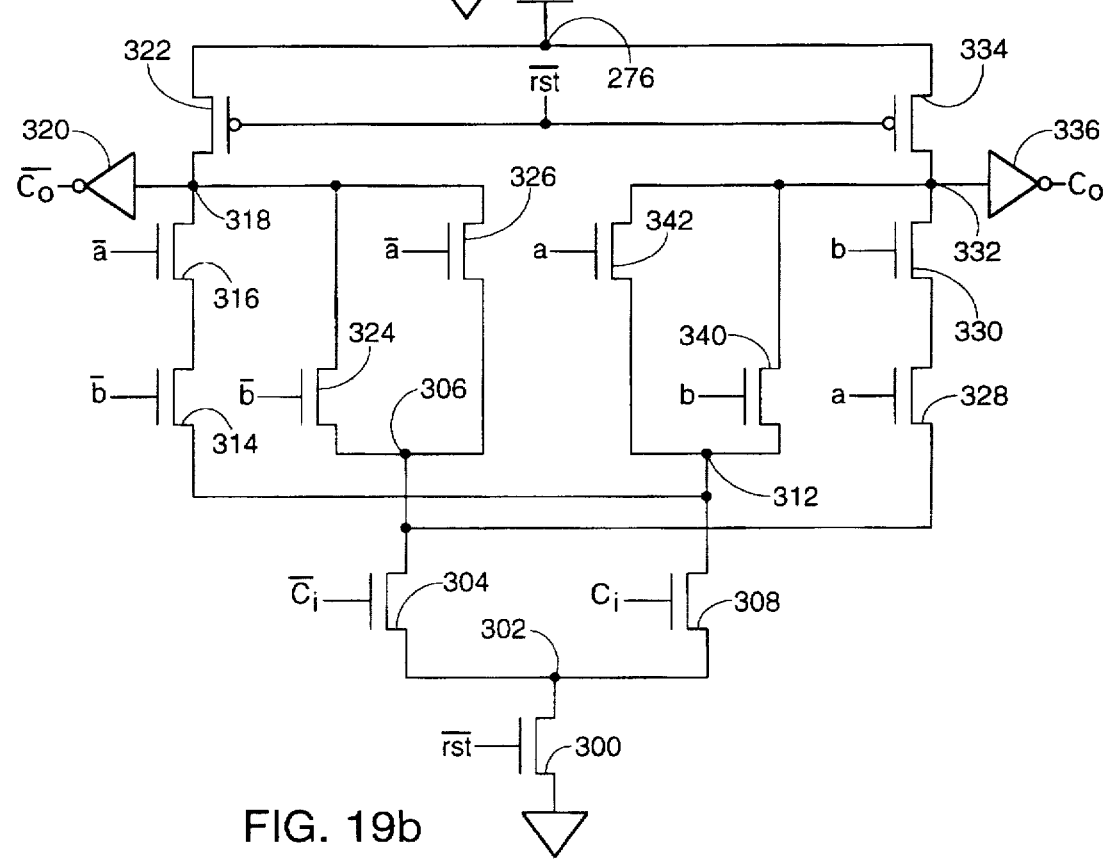
FIG. 19b illustrates a schematic diagram of the Carry portion of the dynamic Full Adder with an integrated complement structure.

Referring now to FIGS. 19a and 19b, there is illustrated a schematic diagram of the Full Adder, FIG. 14a illustrating the Full Adder for generating the SUM signal, and the SUM-Bar signal and FIG. 14b illustrating the portion of the schematic for generating the Carry-Out signal Co and the complement thereof With specific reference to FIG. 19a, the inputs to the Full Adder for generating the SUM signal and the complement thereof are the inputs a, b, a-Bar, b-Bar, Ci and Ci-Bar, in addition to a reset signal rst-Bar. An N-channel transistor 252 has the source/drain path connected between ground and a node 254, the gate thereof connected to the rst-Bar signal. An N-channel transistor 256 has the source/drain path connected between the node 254 and a node 258, the gate thereof connected to the carry input Ci. An N-channel transistor 260 has the source/drain path thereof connected between the node 254 and a node 262 and the gate thereof connected to the carry input Ci-Bar. An N-channel transistor 264 has the source/drain path thereof connected between the node 262 and a node 266, the gate thereof connected to the b-input. An N-channel transistor 268 has the source/drain path thereof connected between the node 266 and a node 270, the gate thereof connected to the a-input. Node 270 is connected through an inverter 272 to provide the SUM-Bar output. A P-channel transistor 274 has the source/drain path thereof connected between node 270 and a power supply node 276, the gate thereof connected to the reset input rst-Bar. N-channel transistor 278 has the source/drain path thereof connected between the node 258 and the node 266 and the gate thereof connected to the b-Bar input. N-channel transistor 280 has the source/drain path thereof connected between the node 270 and a node 282, the gate thereof connected to the a-Bar input. An N-channel transistor 284 has the source/drain path thereof connected between the node 258 and the node 282 and the gate thereof connected to the b-input. N-channel transistor 286 has the source/drain path thereof connected between the node 282 and a node 288, with the gate thereof connected with the a-input. The node 288 is connected through an inverter 290 to provide on the output the SUM signal. An N-channel transistor 292 has the source/drain path thereof connected between the node 262 and the node 284 and the gate thereof connected to the b-Bar input. A transistor 294 has the source/drain path thereof connected between the node 266 and the node 280 and the gate thereof connected to the a-Bar input.

In operation, transistors 268, 264 and 260 provide a NAND function of the inputs a, b and Ci-Bar. Transistors 268, 278 and 256 provide the NAND function between the inputs a, b-Bar and Ci. Transistors 280, 284 and 256 provide the NAND function between the a-Bar, b and Ci inputs. The transistors 280, 292 and 260 are the NAND function between the inputs a-Bar, b-Bar and Ci-Bar. The transistors 286, 284 and 256 provide the NAND function between the inputs a, b and Ci. Transistors 286, 292 and 260 provide the NAND function between the inputs a, b-Bar and Ci-Bar. Transistors 294, 264 and 260 provide the NAND function between the inputs a-Bar, b and Ci-Bar. Transistors 294, 278 and 256 provide the NAND function between the inputs a-Bar, b-Bar and Ci. The node 288 provides an OR function, as does node 270. Node 282 also provides an OR function, as does the node 266.

To insert a zero, the rst-Bar signal is pulled low to turn on transistor 274 and transistor 287, thus pulling nodes 270 and 288 high. Transistor 252 is turned off. As nodes 270 and 288 are complements of each other, one of two nodes will be high before the reset operation. During a reset operation, both nodes are pulled high, such that the lower of nodes 270 and 288 will be charged, thus drawing current from the node 276. When the rst-Bar signal is again pulled high, transistors 274 and 287 are turned off. One of the nodes 270 and 280 will again go low. When one of these nodes goes low, a corresponding one of the inverters 272 and 290 will at the output thereof be pulled high, thus causing the transition.

Referring specifically to FIG. 19b, there is illustrated a schematic diagram of the Carry-Out portion of the Full Adder. The signal inputs to the Full Adder are a, b, a-Bar, b-Bar, Ci-Bar, Ci, and rst-Bar. An N-channel transistor 300 has the source/drain path thereof connected to ground and a node 302 and the gate thereof connected to the rst-Bar input. An N-channel transistor 304 has the source/drain path thereof connected to the node 302 and a node 306, the gate of transistor 304 connected to the Ci-Bar input, a transistor 308 has the source/drain path thereof connected between the node 302 and a node 312 and the gate thereof connected to the Ci-input. An N-channel transistor 314 has the source/drain path thereof connected between the node 312 and the input side of the source/drain path of an N-channel transistor 316, the gate of transistor 314 connected to the b-Bar input. The other side of the source/drain path of transistor 316 is connected to a node 318, and the gate thereof connected to the a-Bar input. The node 318 is connected through an inverter 320 to provide on the output thereof the Co-Bar carry output. A P-channel transistor 322 has the source/drain path thereof connected between the node 318 and the power supply node 376, the gate thereof connected to the rst-Bar input. An N-channel transistor 324 has the source/drain path thereof connected between the node 306 and the node 318 and the gate thereof connected to the b-Bar input. An N-channel transistor 326 has the source/drain path thereof connected between the node 306 and the node 318 and the gate thereof connected to the a-Bar input. An N-channel transistor 328 has the source/drain path thereof connected between the node 306 and one side of the source/drain path of a transistor 330, the gate of transistor 328 connected to the a-input. Transistor 330 has the other side of the source/drain path thereof connected to a node 332 and the gate thereof connected to the b-input. A P-channel transistor 334 has the source/drain path thereof connected between the node 332 and the power supply node 376 and the gate thereof connected to the rst-Bar input. The node 332 is connected through an inverter 336 to provide the Co output. An N-channel transistor 340 has the source/drain path thereof connected between the node 312 and the node 332 and the gate thereof connected to the b-input. An N-channel transistor 342 has the source/drain path thereof connected between the node 312 and the node 332 and the gate thereof connected to the a-input.

In operation, the nodes 318 and 332 provide the complementary outputs and are therefore normally disposed at opposite levels. However, when the rst-Bar signal is pulled low, transistors 322 and 324 are turned on and transistor 300 is turned off, thus raising the level for both of the nodes 318 and 330 to a high level. This will cause both the Carry output and the complement output to go low and cause the transition when current is drawn through one of the transistors 322 and 334 pulling one of the nodes 318 and 332 that was predisposed at the low signal level to a high signal level. When transistors 322 and 334 are again turned off after the rst-Bar signal is pulled high, one of the nodes 318 and 332 will be discharged and pulled low, thus causing the corresponding output of the respective inverter 320 or 336 to go high, causing a transition. This effectively inserts a zero into the adder without disrupting the operation thereof.

The dynamic Full Adder of FIGS. 19a and 19b is associated only with the least significant bit. The Full Adder associated with the most significant bit does not require the transistor 252 or the transistor 300. Since the initial Carry-in and its complement to the least significant bit typically have fixed values and one of them is equal to a logic "1", transistor 252 or transistor 300 are utilized to insure that no conduction from the output nodes to ground occur when rst-Bar is equal to a logic "0". The Carry-in and its complement to following Full Adders are the Carry-out and its complement of previous Full Adders which are guaranteed to both equal a logic "0" when rst-Bar equals a logic "0", which also guarantees that no conduction from the output nodes to ground will occur. A self-timed control mechanism is embedded in this structure, such that the same rst-Bar can be used for every Full Adder in a Full Adder chain. It works as follows: when rst-Bar goes high, if the previous stage is not done yet, such that both $C_{in}$ and $C_{in}$-Bar are equal to "0" no transition will occur in the four output nodes, 188, 170, 232 and 216 of the current stage. Therefore, intermediate transitions due to carry ripple through are eliminated. The values of a, a-Bar, b and b-Bar can change only when the value rst-Bar is equal to zero. The value of Ci and Ci-Bar can change once from logic "0" to logic "1" when the value rst-Bar is equal to a logic "1". The transistors 256 and 260 and the transistors 304 and 308 connected to the Carry-input and the complement thereof are disposed at the position in the structure closest to the ground node in order to avoid any charge redistribution.

Figure 20A:
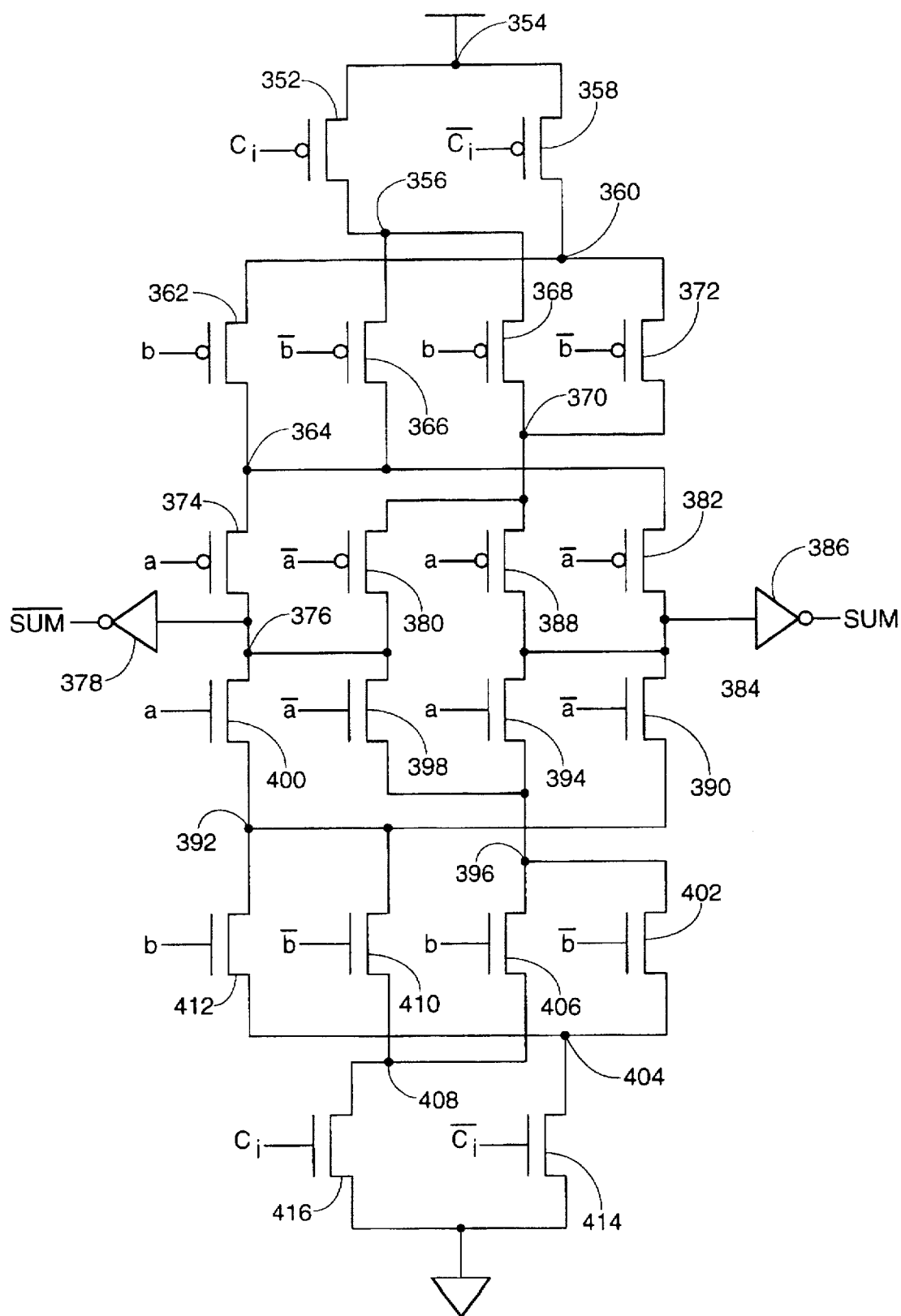
FIGS. 20a and 20b illustrate a schematic diagram of a static Full Adder with an integrated complement structure.
Figure 20B:
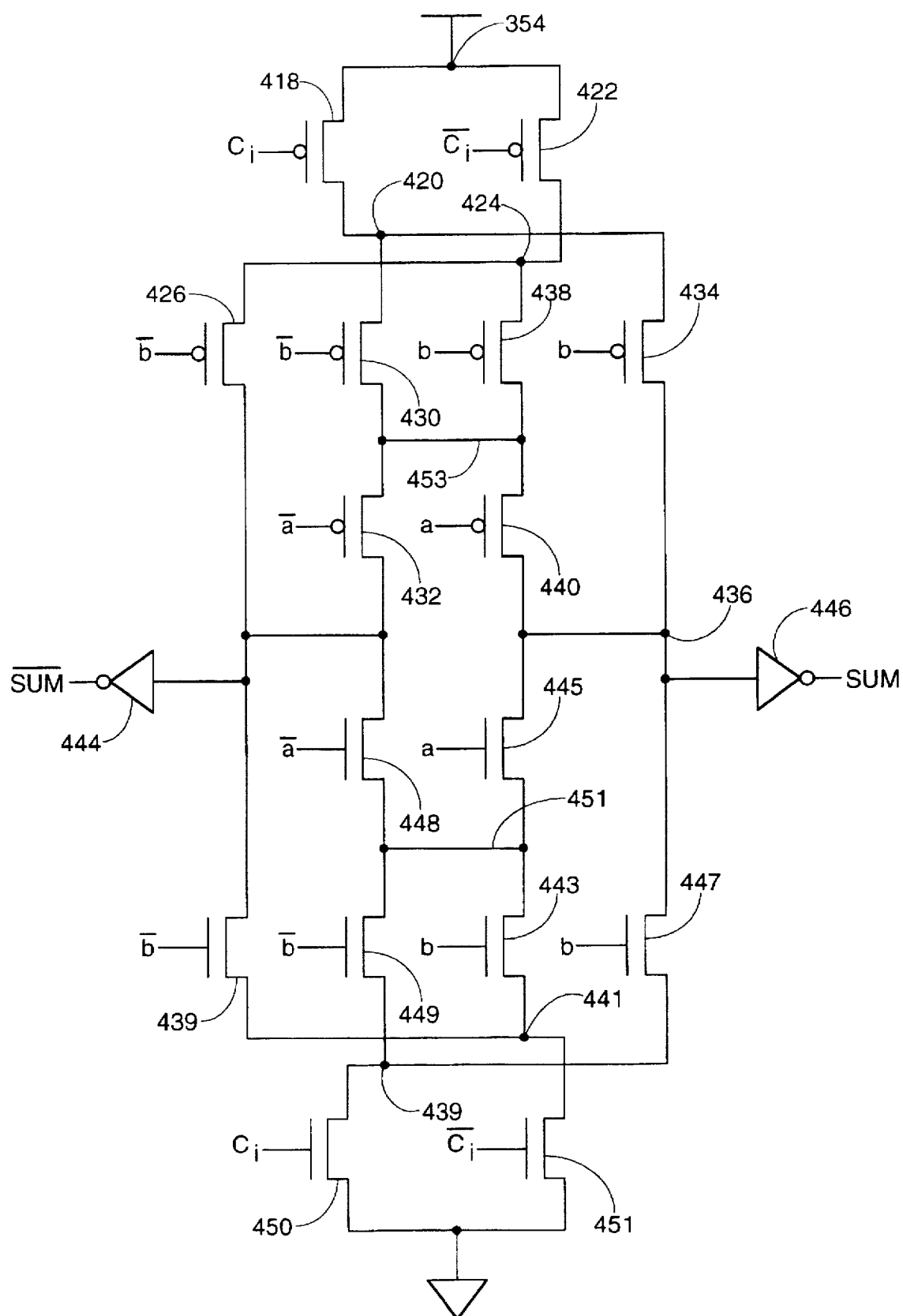

Referring now to FIGS. 20a and 20b, there is illustrated a schematic diagram for the SUM portion and carry portion of a noise invariant Full Adder. A P-channel transistor is connected between a power supply node 354 and a node 356, with the gate thereof connected to the Carry-input and a P-channel transistor 358 is connected between the node 354 and a node 360, the gate thereof connected to the complement of the Carry-input. A P-channel transistor 372 is connected between node 360 and a node 364, with the gate thereof connected to the b-input. A transistor 366 is connected between node 356 and node 364, the gate thereof connected to the b-Bar input. A transistor 368 is connected between node 356 and a node 370, the gate thereof connected to the b-input. A transistor 372 is connected between node 360 and node 370, the gate thereof connected to the b-Bar input. A P-channel transistor 374 is connected between node 364 and a node 376, the gate thereof connected to the a-input. Node 376 comprises the SUM-Bar output, which is connected to the input of an inverter 378, the output thereof providing the SUM-Bar output. A P-channel transistor 380 is connected between node 370 and node 376, the gate thereof connected to the a-Bar input. A P-channel transistor 382 is connected between node 364 and a node 384, the gate thereof connected to the a-Bar input.

Node 384 comprises the SUM output and is connected to the input of an inverter 386. the output thereof comprising the SUM output. A P-channel transistor 388 is connected between node 370 and node 384, the gate thereof connected to the a-input. An N-channel transistor 390 is connected between node 384 and a node 392. the gate thereof connected to the a-Bar input. An N-channel transistor 394 is connected between node 384 and a node 396, the gate thereof connected to the a-input. An N-channel transistor 398 is connected between node 376 and node 396, the gate thereof connected to the a-Bar input. An N-channel transistor 400 is connected between node 376 and node 392. the gate thereof connected to the a-input. An N-channel transistor 402 is connected between node 396 and a node 404, the gate thereof connected to the b-Bar input. An N-channel transistor 406 is connected between node 396 and a node 408. the gate thereof connected to the b-input. An N-channel transistor 410 is connected between node 392 and node 408, the gate thereof connected to the b-Bar input. An N-channel transistor 412 is connected between node 392 and node 404, the gate thereof connected to the b-input. An N-channel transistor 414 is connected between node 404 and ground, the gate thereof connected to the Ci-Bar input and an N-channel transistor 416 is connected between node 408 and ground, with the gate thereof connected to the Ci input.

The carry portion of the static Full Adder is illustrated in FIG. 20b. A P-channel transistor 418 is connected between node 354 and a node 420 and a P-channel transistor 422 is connected between node 354 and a node 424. A P-channel transistor 426 is connected between node 424 and a node 428 with the gate thereof connected to the b-Bar input. Two series connected P-channel transistors 430 and 432 are connected together to a node 453 and between node 420 and node 428, with the gate of transistor 430 connected to the b-Bar input and the gate of transistor 432 connected to the a-Bar input. A P-channel transistor 434 is connected between node 422 and a node 436. Two series connected transistors, P-channel transistor 438 and N-channel transistor 440, are connected together to node 453 and between node 324 and node 436, with the gate of transistor 438 connected to the b-input and the gate of transistor 440 connected to the a-input. The node 328 comprises the Co-Bar output, which is provided on the output of an inverter 444, which connects on the input thereof to node 428. Similarly, an inverter 446 having an input thereof connected to node 436 provides on the output thereof the Co carry output. Two series connected N-channel transistors 445 and 443 are connected together at node 451 and between node 436 and a node 441, the gate of transistor 445 connected to the a-input, and the gate of transistor 443 connected to the b-input. An N-channel transistor 447 is connected between node 446 and a node 439, the gate thereof connected to the b-input. Two series connected N-channel transistors 448 and 449 are connected together at node 451 and between node 428 and node 439, the gate of transistor 448 connected to the a-bar input and the gate of transistor 449 connected to the b-Bar input. An N-channel transistor 450 is connected between node 439 and ground and the gate thereof connected to the Ci input. An N-channel transistor 451 is connected between node 441 and ground, the gate thereof connected to the Ci-Bar input.

The static Full Adder of FIGS. 20a and 20b are utilized for any bit in the Full Adder chain. Since this is a static device, no timing restrictions are placed on the inputs; rather, the inputs have to have a noise invariant pattern, i.e., has an inserted "0", to achieve noise invariance. Any internal glitches will not add to the noise, as they in and of themselves are noise invariant.

Figure 21A:
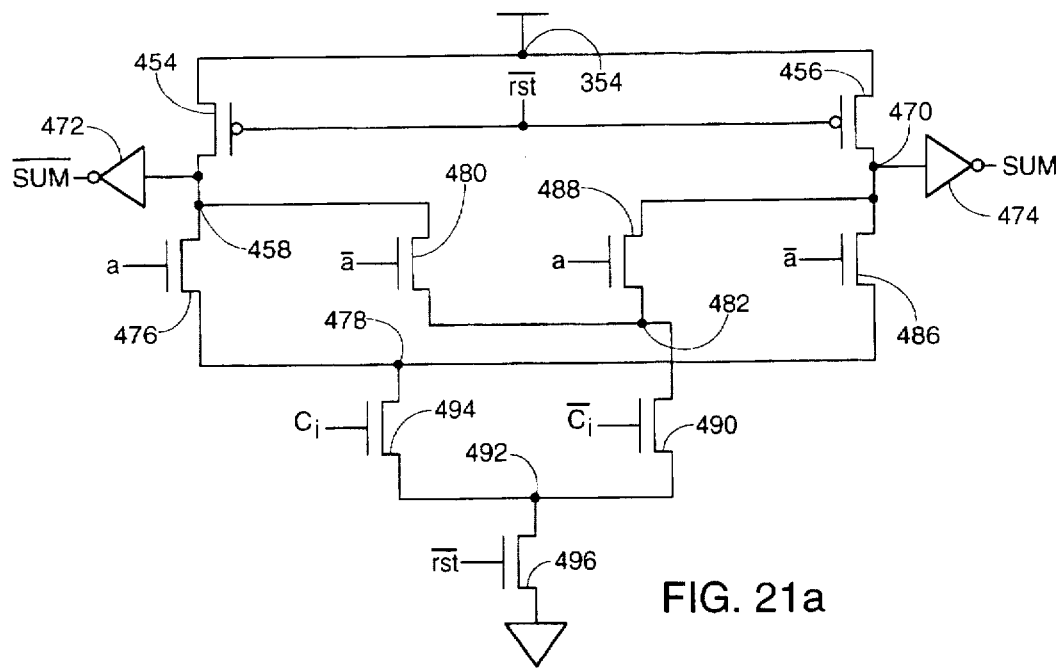
FIGS. 21a and 21b illustrate a diagrammatic view of a dynamic Half Adder with an integrated complement structure.
Figure 21B:
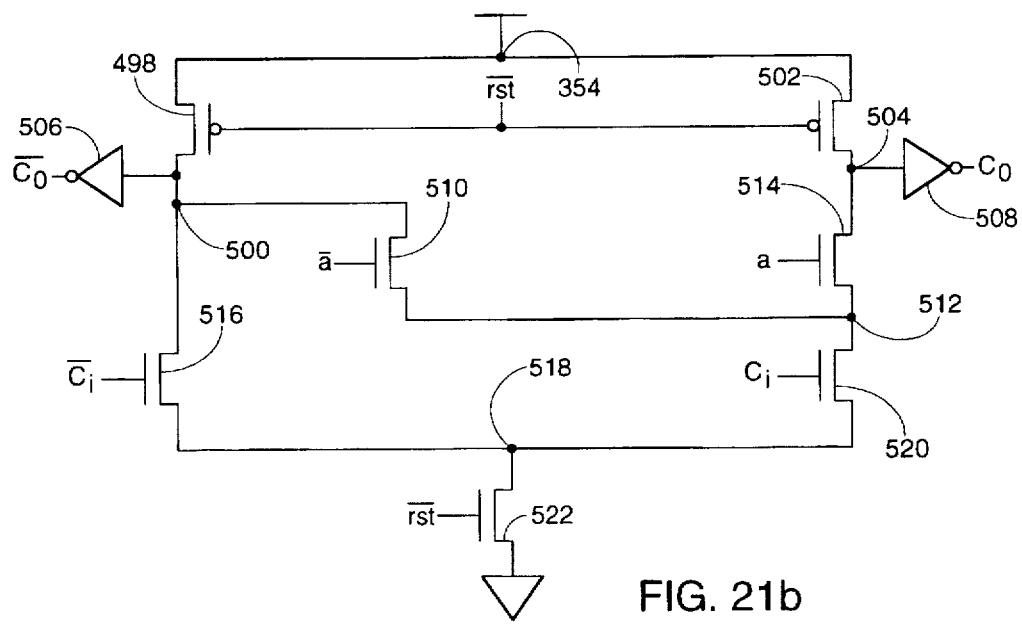

Referring now to FIGS. 21a and 21b, there is illustrated a schematic diagram of a noise invariant dynamic Half Adder. The FIG. 21a illustrates the SUM portion and FIG. 21b illustrates the Carry-Out portion. With respect to FIG. 21a, a P-channel transistor 454 is disposed between the power supply node 453 and a node 458, the gate thereof connected to the rst-Bar signal. A P-channel transistor 456 is connected between node 453 and a node 470, the gate thereof connected to the rst-Bar signal. Node 458 is connected through an inverter 472 to provide the SUM-Bar signal. Similarly, the node 470 is connected through an inverter 474 to provide the SUM output. An N-channel transistor 476 is connected between node 458 and a node 478, the gate thereof connected to the a-input. An N-channel transistor 480 is connected between node 458 and a node 482, the gate thereof connected to the a-Bar input. An N-channel transistor 486 is connected between node 470 and node 478, the gate thereof connected to the a-bar input. An N-channel transistor 488 is connected between node 470 and node 482, the gate thereof connected to the a-input. An N-channel transistor 490 is connected between node 482 and a node 492, the gate thereof connected to the Ci-Bar input. An N-channel transistor 494 is connected between node 478 and node 482, the gate thereof connected to the Ci-input. An N-channel transistor 496 is connected between node 492 and ground, the gate thereof connected to the rst-Bar input.

Referring now to FIG. 21b, a P-channel transistor 498 is connected between node 454 and a node 500, the gate thereof connected to the rst-Bar input. A P-channel transistor 502 is connected between node 454 and a node 504, the gate thereof connected to the rst-Bar input. Node 504 is connected through an inverter 508 to provide the Co-Bar output, and node 504 is connected through an inverter 508 to provide the Co-output. An N-channel transistor 510 is connected between node 500 and a node 512, the gate thereof connected to the a-Bar input. An N-channel transistor 514 is connected between node 504 and node 512, the gate thereof connected to the a-input. An N-channel transistor 516 is connected between node 500 and a node 518, the gate thereof connected to the Ci-Bar input. An N-channel transistor 520 is connected between node 512 and node 518, the gate thereof connected to the Ci-input. An N-channel transistor 522 is connected between node 518 and ground, the gate thereof connected to the rst-bar input.

The structures of FIGS. 21a and 21b are utilized for the least significant bit (LSB) with remaining bits in the Half Adder carry chain, not having the transistors 496 and 522 associated therewith, the nodes 492 and 518 connected directly to ground. The inputs a and a-Bar can change only when rst-Bar is equal to a logic "0". The carry inputs Ci and Ci-Bar can change once from logic "0" to logic "1" when rst-Bar is equal to a logic "1". The transistors 496 and 522 provide a pull-down function which insure no conduction when the value of rst-Bar is equal to logic "0". Additionally, the transistors 494 and 490 and the transistors 516 and 520 associated with the carry inputs are connected closest to ground to avoid charge redistribution, as was described above with reference to the dynamic Full Adder structure.

Figure 22:
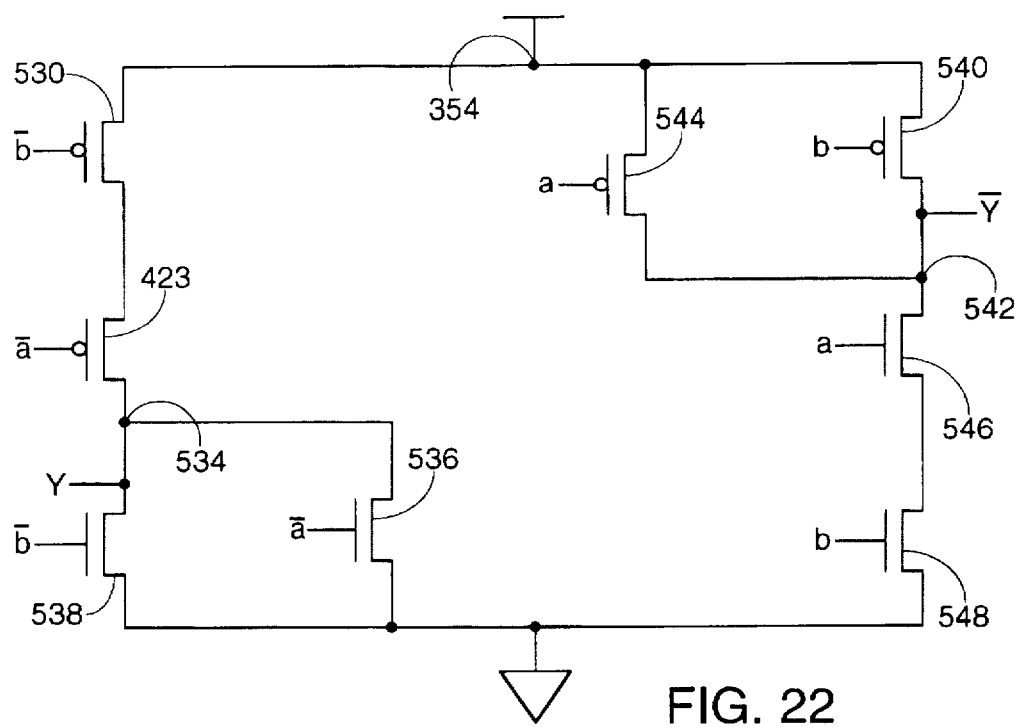
FIG. 22 illustrates a schematic diagram of the AND gate with an integrated complementary structure.

Referring now to FIG. 22, there is illustrated a schematic diagram of a partially noise invariant AND gate that incorporates the complement structure. Two series connected P-channel transistors 530 and 532 are connected between node 254 and an output node 534, output 534 providing the y-output. The gate of transistor 530 is connected to the b-Bar input and the gate of transistor 532 is connected to the a-Bar input. An N-channel transistor 536 is connected between node 534 and ground, the gate thereof connected to the a-Bar input. An N-channel transistor 538 is connected between node 534 and ground, the gate thereof connected to the b-Bar input. A P-channel transistor 540 is connected between node 254 and a node 542, node 542 comprising the Y-Bar output, the gate of transistor 540 connected to b-input. A P-channel transistor 544 is connected between node 254 and node 542, the gate thereof connected to the a-input. Two series connected transistors 546 and 548 are connected between node 542 and ground, the gate of transistor 546 connected to the a-bar input and the gate of transistor 548 connected to the b-input.

The transistors 423, 530, 538 and 536 perform a NOR function with the input being a-Bar and b-Bar and the output thereof being Y. The complement to this is a NAND function which receives the input a and the input b and provide on the output thereof the output Y-Bar. This therefore provides the two complement functions from a logic standpoint.

Figure 23:
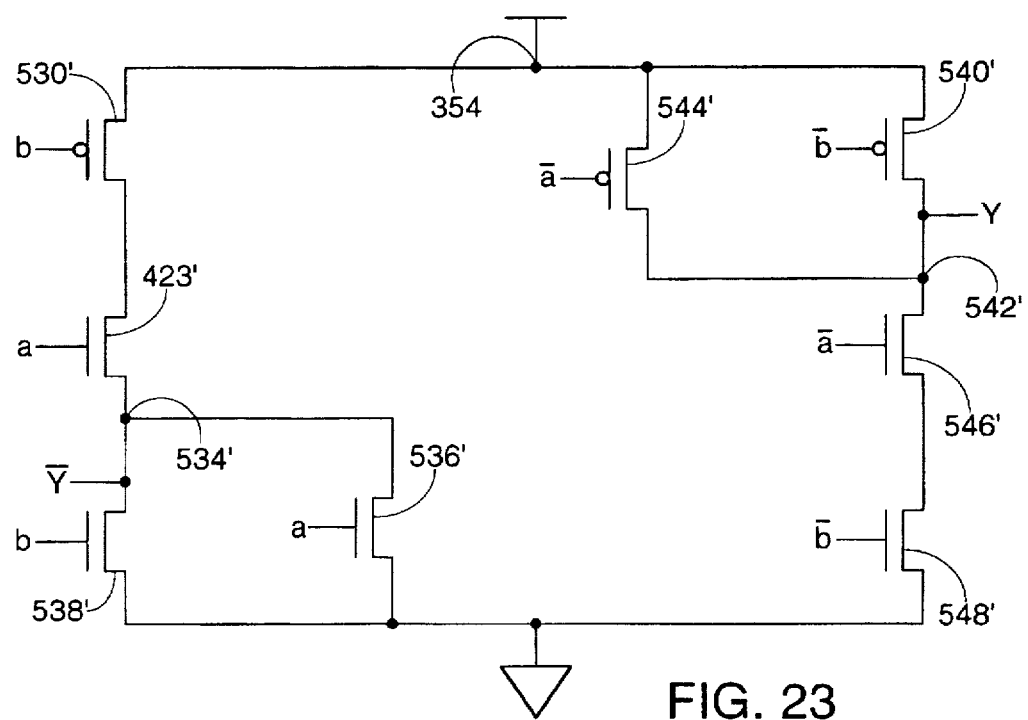
FIG. 23 illustrates a schematic diagram of an OR gate with an integrated complementary structure.

Referring now to FIG. 23, there is illustrated a schematic diagram of the OR function, which is identical to the schematic diagram of the AND gate of FIG. 22, with the exception that the transistors and nodes now bear a "prime" notation. Additionally, the polarity of all inputs is changed, the output node 542' is the Y-output and the output node 534' is the Y-Bar output. The transistors 423', 530', 538' and 536' provide a NOR function with the inputs being a and b and the output being Y-Bar. The transistors 540', 544', 546' and 548' provide the NAND function, receiving the inputs a-Bar and b-Bar and the output being Y. This is therefore the complement function.

Figure 24:
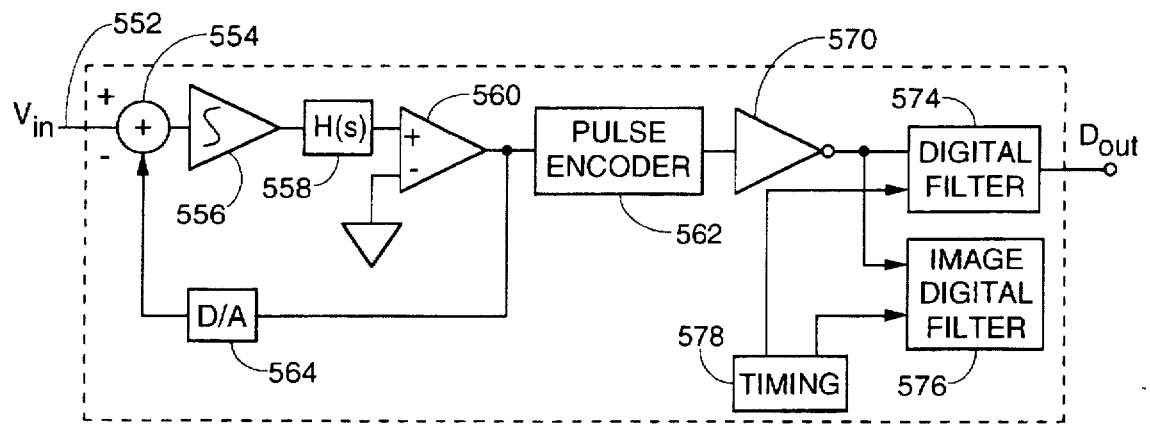
FIG. 24 illustrates a block diagram of a preferred application for an A/D converter.

Referring now to FIG. 24, there is illustrated a block diagram of one application of the DSP utilizing mirror circuitry to image each mathematical process. In the embodiment of FIG. 24, there is illustrated a delta-sigma modulator with a digital filter disposed on the output. Analog signals received on an input node 552, which is then input to a summing circuit 554, the output thereof driving an integrator 556. The output integrator 556 is input to a loop filter 558 with the output thereof input to a comparator 560. The other input of the comparator 560, the negative input, is connected to a reference voltage of ground. The output of the comparator 560 is a digital signal which is input to both the input of a pulse encoder 562 and also to the input of a d/a converter 564. The output of pulse encoder 562 is input to the input of a CMOS output 570, the output thereof connected to the input of a main digital filter 574, and also to the input of an image digital filter 576. The output of the main digital filter 574 provides a digital output. Timing is provided by timing block 578. The output of the d/a converter 564 is input to the negative input of the summation circuit 554. This, therefore, forms a conventional delta sigma modulator which, in the preferred embodiment, provides an output on the comparator a one-bit digital stream.

Although the embodiment illustrated in FIG. 24 utilizes an analog processing system that is later filtered, it should be understood that a digital input signal could be received and processed in the digital domain with the output thereof provided as an input to a digital/analog converter. The utilization of mirror circuitry in the additional processing portion will again provide the advantages of reducing, if not eliminating, the pattern dependent noise associated with the digital processing portion of the system.

In summary, there has been provided a digital signal processing system that utilizes a complete mirror of the digital processing circuitry to reduce pattern dependent noise. By inserting zeros into each cycle, it can be insured that each data cycle or bit field will have a positive transition and a negative transition associated therewith, such that a similar amount of current will be drawn from the power supply for each cycle. In the mirror circuit, the image of the process in the main digital processing circuit is performed. Therefore, whenever a transition occurs on a data node in the main portion of the digital processing system, no transition will occur in the corresponding data node in the image portion. Conversely, whenever the data process is such that no transition occurs on a given data node during a data cycle in the main digital processing system, a transition will occur on the corresponding data node in the image processing system. The image processing system is configured such that for each data node in the main digital processing system that can undergo a transition, there will be a similar data node in the image portion that will be the complement of the operation of the data node in the main digital processing system.

Although the preferred embodiment has been described in detail, it should be understood that various changes, substitutions and alterations can be made therein without departing from the spirit and scope of the invention as defined by the appended claims.

What is claimed is:

1. A digital signal processor for processing digital data, comprising:
    a main digital processing circuit comprised of main logic elements for receiving and processing the digital data to provide a digital output; and
    a mirror digital processing circuit that mirrors at least a portion of said main digital processing circuit, said mirror digital processing circuit comprised of the complement of the main logic elements in said portion and operable to receive and process the complement of the signals processed by said portion of said main digital processing circuit and at the same time, and provide a digital output therefrom, such that the true and complement functions associated with said portion of said main digital processing circuit and said mirror digital processing circuit, respectively, are being processed simultaneously.

2. The digital signal processor of claim 1, wherein said mirror digital processing circuit processes the complement of the signals processed by said portion at substantially the same time as the digital signals are processed by said portion.

3. The digital signal processor of claim 1, wherein at least said portion of said main digital processing circuit and said mirror circuit operate on a return-to-zero format in a binary system such that at least one of the logic states requires a positive transition and a negative transition for representation thereof.

4. The digital signal processor of claim 1, wherein said portion encompasses substantially all of said main logic elements of said main digital processing circuit.

5. The digital signal processor of claim 1, wherein said main logic elements in said main digital processing circuit comprise, in part, logic gates.

6. The digital signal processor of claim 1, wherein said main logic elements in said main digital processing circuit comprise, in part, registers.

7. The digital signal processor of claim 1, wherein said main logic elements in said main digital processing circuit comprise, in part, adders.

8. The digital signal processor of claim 1, wherein said main digital processing circuit includes a plurality of main data nodes and wherein said main data nodes undergo data transitions during processing of digital data through said main digital processing circuit, and said mirror digital processing circuit includes a plurality of complementary data nodes, each of said complementary data nodes corresponding to one of said main data nodes in said portion, and each of said complementary data nodes undergoing the complement of the data transitions that the corresponding one of said main data nodes undergoes.

9. The digital signal processor of claim 8, wherein at least said portion of said main digital processing circuit and said mirror digital processing circuit operate on a return-to-zero format in a binary system such that at least one of the logic states requires a positive transition and a negative transition for representation thereof.

10. The digital signal processor of claim 9, wherein said combined positive transitions and negative transitions of said main digital processing circuit in said portion of said main digital processing circuit are periodic.

11. The digital signal processor of claim 10, and further comprising a sampled data conversion circuit coupled to the digital processing system for converting between an analog signal and a digital signal and operating at a sampling frequency.

12. The digital signal processor of claim 11, wherein said combined positive transitions and negative transitions of said mirror digital processing circuit and said portion of said main digital processing circuit are a multiple of said sampling frequency.

13. The digital signal processor of claim 1, and further comprising a sampled data conversion circuit coupled to the digital processing system for converting between an analog signal and a digital signal and operating at a sampling frequency.

14. The digital signal processor of claim 1, wherein said main logic elements in said portion comprise, in part, combinatorial logic elements.

15. The digital signal processor of claim 1, wherein said main logic elements in said portion of said main digital processing circuit comprise, in part, sequential logic elements.

16. A digital processing system for processing digital data, comprising:
    a primary digital processing circuit comprising a plurality of primary logic elements;
    a complementary digital processing circuit that comprises a plurality of complementary logic elements, each of said complementary logic elements being the complement of the corresponding one of said primary logic elements in said primary digital processing circuit;
    a primary connectivity network for connecting select ones of said primary logic elements and select ones of said complementary logic elements to provide a primary digital processing chain for processing the digital data therethrough to provide a digital output; and
    a mirror network for connecting the remaining ones of said primary logic elements and the remaining ones of said complementary logic elements connected in a complementary digital processing chain that is the complement of said primary digital processing chain and operable to process the complement of the digital data therethrough, such that said complementary logic elements and said associated primary logic elements operate at the same time to process the complementary and true data, respectively.

17. The digital processing system of claim 16, wherein said primary digital processing chain and said complementary digital processing chain operate in a return-to-zero format in a binary system such that at least one of the logic states requires a positive transition and a negative transition for representation thereof.

18. The digital processing system of claim 16, wherein said primary logic elements comprise, in part, logic gates.

19. The digital processing system of claim 16, wherein said primary logic elements comprise, in part, registers.

20. The digital processing system of claim 16, wherein said primary logic elements comprise, in part, adders.

21. The digital processing system of claim 16, wherein said primary digital processing chain includes a plurality of primary data nodes, wherein said primary data nodes undergo data transitions during processing of digital data through said primary digital processing chain, and said complementary digital processing chain includes a plurality of complementary data nodes, each of said complementary data nodes corresponding to one of said primary data nodes in said primary digital processing chain, and each of said complementary data nodes undergoing the complement of the data transitions that the corresponding one of said primary data nodes undergoes.

22. The digital processing system of claim 21, wherein said primary digital processing chain and said complementary digital processing chain operate on a return-to-zero format in a binary system such that at least one of the logic states requires a positive transition and a negative transition for representation thereof.

23. The digital processing system of claim 22, wherein said combined positive transitions and negative transitions of said main digital processing chain are periodic.

24. The digital processing system of claim 23, and further comprising a sample data conversion circuit coupled to the digital processing system for converting between an analog signal and a digital signal and operating at a sampling frequency.

25. The digital processing system of claim 24, wherein said positive transitions and negative transitions of said complementary digital processing chain and said primary digital processing chain are a multiple of said sampling frequency.

26. The digital processing system of claim 16, and further comprising a sampled data conversion circuit coupled to the digital processing system for converting between an analog signal and a digital signal and operating at a sampling frequency.

27. The digital processing system of claim 16, wherein the primary logic elements comprise, in part, combinatorial logic elements.

28. The digital processing system of claim 16, wherein said primary logic elements comprise, in part, sequential logic elements.

29. A method for processing digital data in a digital signal processor, comprising the steps of:
    arranging a plurality of main logic elements in a predetermined main digital processing configuration;
    receiving and processing the digital data through the main digital processing configuration and providing a digital output;
    arranging a plurality of mirror logic elements in a mirror digital processing configuration, the mirror logic elements each comprising the complement of a corresponding one of the main logic elements in at least a portion of the main digital processing configuration, wherein the mirror digital processing configuration corresponds to the complement of the portion of the main digital processing configuration; and
    processing the complement of the digital data processed through the portion of the main digital processing configuration through the mirror digital processing configuration at the same time as the digital data is processed through the associated portion of the main digital processing configuration, such that the true and complement functions associated with the portion of the main digital processing configuration and associated mirror digital processing configuration are being processed simultaneously.

30. The method of claim 29, wherein the step of processing the digital data through the mirror digital processing configuration comprises processing the complement of the signal processed by the portion of the main digital processing configuration through the mirror digital processing configuration at substantially the same time as the digital signals are processed by the portion of the main digital processing configuration.

31. The method of claim 30, wherein the portion of the main digital processing configuration encompasses substantially all of the main logic elements in the main digital processing configuration.

32. The method of claim 29, wherein the mirror digital processing configuration and the main digital processing configuration operate on a return-to-zero format in a binary system such that at least one of the logic states require a positive transition and a negative transition for representation thereof.

33. The method of claim 29, wherein the main logic elements in the main digital processing configuration comprise, in part, logic gates.

34. The method of claim 29, wherein the main logic elements in the digital processing configuration comprise, in part, registers.

35. The method of claim 29, wherein the main logic elements in the main digital processing configuration comprise, in part, adders.

36. The method of claim 29, wherein the portion of the main digital processing configuration includes a plurality of data nodes and wherein the step of processing the digital data through the main digital processing configuration is operable to exercise the main data nodes to undergo data transitions during processing of digital data through the main digital processing configuration, the mirror digital processing configuration including a plurality of complementary data nodes, each of the complementary data nodes corresponding to one of the main data nodes in the portion of the main digital processing configuration, and each of the complementary data nodes exercised to undergo the complement of the data transition that the corresponding one of the main data nodes undergoes during the step of processing the data through the mirror digital processing configuration.

37. The method of claim 36, wherein at least the portion of the main digital processing configuration and the mirror digital processing configuration operate on a return-to-zero format in a binary system such that at least one of the logic states requires a positive transition and a negative transition for representation thereof.

38. The method of claim 37, wherein the combined positive transitions and negative transitions of the main digital processing configuration in the portion of the main digital processing configuration are periodic.

39. The method of claim 38, and further comprising, coupling a sampled data conversion circuit to the main digital processing configuration for converting between an analog signal and a digital signal and operating at a sampling frequency.

40. The method of claim 39, wherein the combined positive transitions and negative transitions of the mirror digital processing configuration and the portion of the main digital processing configuration are a multiple of the sampling frequency.

41. The method of claim 29, and further comprising coupling a sampled data conversion circuit to the main digital processing configuration and converting between an analog signal and digital signal and operating at a sampling frequency.

42. The method of claim 29, wherein the main logic elements in the portion of the main digital processing configuration comprise, in part, combinatorial logic elements.

43. The method of claim 29, wherein the main logic elements in the portion of the main digital processing configuration comprise, in part, sequential logic elements.

* * * * *